(12) United States Patent
Kobayashi et al.

(10) Patent No.: US 8,232,639 B2
(45) Date of Patent: Jul. 31, 2012

(54) SEMICONDUCTOR-DEVICE MOUNTED BOARD AND METHOD OF MANUFACTURING THE SAME

(75) Inventors: Toshio Kobayashi, Nagano (JP);
Takaharu Yamano, Nagano (JP);
Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 141 days.

(21) Appl. No.: 12/952,452

(22) Filed: Nov. 23, 2010

(65) Prior Publication Data
US 2011/0127656 A1    Jun. 2, 2011

(30) Foreign Application Priority Data
Nov. 30, 2009   (JP) .................. 2009-271902

(51) Int. Cl.
*H01L 23/48* (2006.01)

(52) U.S. Cl. .............. 257/736; 257/784; 257/E23.06; 438/125

(58) Field of Classification Search .......... 257/736, 257/784, E23.06; 438/125
See application file for complete search history.

(56) References Cited

U.S. PATENT DOCUMENTS

| | | | |
|---|---|---|---|
| 5,875,100 A | 2/1999 | Yamashita | |
| 7,285,728 B2* | 10/2007 | Sunohara et al. | 174/260 |
| 2005/0230794 A1* | 10/2005 | Shizuno | 257/678 |
| 2008/0277776 A1* | 11/2008 | Enomoto | 257/700 |
| 2009/0206470 A1* | 8/2009 | Horiuchi et al. | 257/698 |

FOREIGN PATENT DOCUMENTS

| | | |
|---|---|---|
| JP | 2842378 | 10/1998 |
| JP | 2005-332887 | 12/2005 |
| JP | 2006-222164 | 8/2006 |

* cited by examiner

*Primary Examiner* — Trung Q Dang
(74) *Attorney, Agent, or Firm* — IPUSA, PLLC

(57) ABSTRACT

In a method of manufacturing a semiconductor-device mounted board, connection terminals are formed on electrode pads on a semiconductor integrated circuit respectively. A first insulating layer is formed to cover the connection terminals. A plate-like medium having a rough surface is disposed on the first insulating layer. The rough surface of the plate-like medium is pressed onto the first insulating layer so that a part of each of the connection terminals is exposed. A semiconductor device is produced by removing the plate-like medium. A second insulating layer is formed to cover side surfaces of the semiconductor device. A wiring pattern is formed to cover surfaces of the first and second insulating layers, the wiring pattern being electrically connected to the exposed connection terminal parts.

9 Claims, 25 Drawing Sheets

SEMICONDUCTOR-DEVICE MOUNTED BOARD AND METHOD OF MANUFACTURING THE SAME

CROSS-REFERENCE TO RELATED APPLICATION

This application is based upon and claims the benefit of priority of Japanese patent application No. 2009-271902, filed on Nov. 30, 2009, the entire contents of which are incorporated herein by reference in their entirety.

BACKGROUND OF THE INVENTION

1. Field of the Invention

The present disclosure relates to a semiconductor-device mounted board in which a semiconductor device is mounted, and a method of manufacturing the semiconductor-device mounted board.

2. Description of the Related Art

Conventionally, a wiring board in which a semiconductor device is mounted is known. In the following, such a wiring board will be referred to as a semiconductor-device mounted board. For example, a known method of manufacturing the semiconductor-device mounted board is as follows. A bump is formed on the semiconductor device as a connection terminal which is electrically connected to a semiconductor integrated circuit included in the semiconductor device. The semiconductor device is embedded in the wiring board and the circumference of the semiconductor device is covered with an insulating layer. Perforating of the insulating layer is performed by the application of a laser beam to make a hole in the insulating layer, and the bump on the semiconductor device is exposed at the hole in the insulating layer. A wiring pattern (re-wiring) is formed on the wiring board and connected to the exposed bump. For example, refer to Japanese Patent No. 2842378.

Furthermore, another method of manufacturing a semiconductor-device mounted board is also known. In this manufacturing method, a bump is formed on a semiconductor device as a connection terminal electrically connected to a semiconductor integrated circuit included in the semiconductor device (first step). An insulating layer is formed on the bump (second step). The insulating layer is perforated by the application of a laser beam thereto, so that a via hole reaching the bump on the semiconductor device is formed in the insulating layer with the applied laser beam (third step). The via hole is filled with a conductive material to form a via wiring, and a wiring pattern (re-wiring) is formed so that the wiring pattern is connected to the via wiring (fourth step). By this manufacturing method, when the via hole is formed, the bump is used as a stopper layer of the laser application. For example, refer to Japanese Laid-Open Patent Publication No. 2005-332887 or Japanese Laid-Open Patent Publication No. 2006-222164.

In the above-described manufacturing methods of the semiconductor-device mounted board according to the related art, the laser application step requires much time to form the hole in the insulating layer for exposing the bump on the semiconductor device. There has been a problem that the manufacturing cost of the semiconductor-device mounted board will increase.

In the above-described manufacturing methods of the semiconductor-device mounted board according to the related art, a laser beam with a predetermined spot diameter (for example, a spot diameter on the order of 70 micrometers) is applied for the perforation of an insulating layer. Bumps are formed on the semiconductor device as the connection terminals which provide electrical interconnections of the wiring pattern (re-wiring) and the semiconductor integrated circuit in the semiconductor device. There is a problem that the intervals of the bumps according to the related art must be as large as about 150 micrometers. This has made it difficult to attain high-density formation of connection terminals on a semiconductor device for a finer design.

SUMMARY OF THE INVENTION

In one aspect, the present disclosure provides a semiconductor-device mounted board and a method of manufacturing a semiconductor-device mounted board which are adapted to allow high-density formation of connection terminals on a semiconductor device to electrically connect a wiring pattern (re-wiring) and a semiconductor integrated circuit of the semiconductor device without increasing of the manufacturing cost.

In an embodiment of the invention which solves or reduces one or more of the above-described problems, the present disclosure provides a method of manufacturing a semiconductor-device mounted board, the method including: forming connection terminals on electrode pads of a semiconductor integrated circuit respectively; forming a first insulating layer on the semiconductor integrated circuit to cover the connection terminals formed on the electrode pads; disposing a plate-like medium on the first insulating layer, the plate-like medium having a rough surface on a side of the plate-like medium facing the first insulating layer; pressing the rough surface of the plate-like medium on the first insulating layer so that the first insulating layer is compressed and a part of each of the connection terminals is exposed from the first insulating layer; removing the plate-like medium from the first insulating layer to produce a semiconductor device containing the semiconductor integrated circuit; forming a second insulating layer which covers at least side surfaces of the semiconductor device, the second insulating layer including recesses on a surface of the second insulating layer on the same side as the exposed parts of the connection terminals; and forming a wiring pattern to cover a surface of the first insulating layer including the exposed parts of the connection terminals and a surface of the second insulating layer including the recesses, the wiring pattern being electrically connected to the exposed parts of the connection terminals and including recesses each having a shape in conformity with a shape of one of the recesses of the second insulating layer.

Other objects, features and advantages of the present disclosure will be apparent from the following detailed description when read in conjunction with the accompanying drawings.

DETAILED DESCRIPTION OF PREFERRED EMBODIMENTS

A description will now be given of embodiments of the present disclosure with reference to the accompanying drawings.

Figure 1:
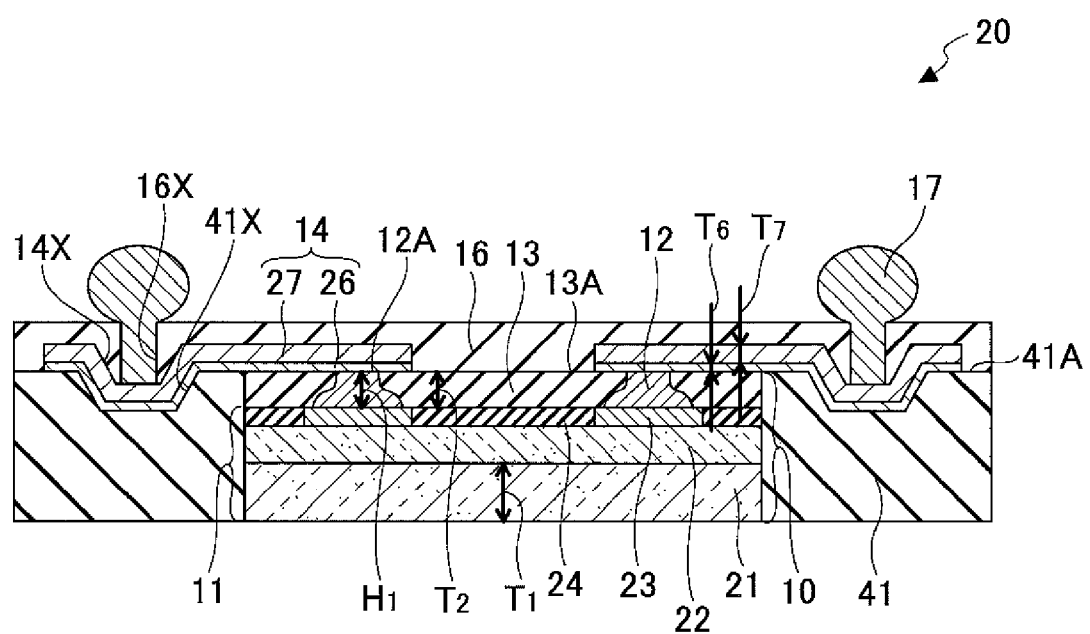
FIG. 1 is a cross-sectional view of a semiconductor-device mounted board of a first embodiment of the present disclosure.

The structure of a semiconductor-device mounted board of a first embodiment of the present disclosure will be described. FIG. 1 is a cross-sectional view of the semiconductor-device mounted board of the first embodiment.

As illustrated in FIG. 1, a semiconductor-device mounted board 20 of this embodiment includes a semiconductor device 10, a wiring pattern 14, a solder resist layer 16, an external connection terminal 17, and an insulating layer 41.

The semiconductor device 10 includes a semiconductor chip 11, connection terminals 12, and an insulating layer 13. In the semiconductor device 10, the semiconductor chip 11 includes a semiconductor substrate 21, a semiconductor integrated circuit 22, electrode pads 23, and a protection film 24. The semiconductor substrate 21 is a substrate on which the semiconductor integrated circuit 22 is formed. The semiconductor substrate 21 is formed to have a reduced thickness. For example, the semiconductor substrate 21 has a thickness T1 on the order of 50 to 500 micrometers. For example, the semiconductor substrate 21 is formed by using a silicon wafer which is formed to have a small thickness and cutting the silicon wafer into pieces.

The semiconductor integrated circuit 22 is disposed on one surface of the semiconductor substrate 21. The semiconductor integrated circuit 22 is made up of a diffusion layer (not shown) formed in the semiconductor substrate 21, an insulating layer (not shown) formed on the semiconductor substrate 21, via holes (not shown) formed in the insulating layer (not shown), a wiring pattern (not shown), etc.

The electrode pads 23 are formed on the semiconductor integrated circuit 22. The electrode pads 23 are electrically connected to the wiring pattern (not shown) formed in the semiconductor integrated circuit 22. For example, the material of each electrode pad 23 may be aluminum. Alternatively, a multi-layered material in which an aluminum layer is deposited on a copper layer, or a multi-layered material in which an aluminum layer is deposited on a silicon layer which is further deposited on a copper layer may be used as the material of each electrode pad 23.

The protection film 24 is formed on the semiconductor integrated circuit 22. The protection film 24 is a film for protecting the semiconductor integrated circuit 22. The protection film 24 may be called a passivation film. For example, a SiN (silicon nitride) film, a PSG (phosphosilicate glass) film, etc. may be used as the protection film 24. Alternatively, a polyimide film may be laminated on the layer of the protection film 24 which is made of a SiN film or a PSG film.

The connection terminals 12 are formed on the electrode pads 23 respectively. Each connection terminal 12 is configured to have a projecting portion. Each connection terminal 12 has a surface 12A which is exposed from a surface 13A of the insulating layer 13, and this surface 12A is electrically connected to the wiring pattern 14. Namely, the connection terminals 12 provide the function to electrically connect the wiring pattern 14 and the semiconductor integrated circuit 22 included in the semiconductor device 10 through the electrode pads 23.

For example, each connection terminal 12 may be formed to have a height H1 above the electrode pad 23 on the order of 10 to 60 micrometers. For example, each connection terminal 12 may be formed from an Au bump, an Au plating film, or a metallic film containing a Ni film formed by electroless plating and an Au film formed to cover the Ni film. For example, Au bumps may be formed with a bonding wire using a wire bonding machine. Alternatively, Au bumps may be formed by plating.

The insulating layer 13 is provided to seal and protect the circuit formation surface (principal surface) of the semiconductor chip 11. The insulating layer 13 is provided as a part of the base material used when the wiring pattern 14 is formed. The insulating layer 13 is formed to cover each connection terminal 12 and the semiconductor chip 11 except the surface 12A of the connection terminal 12. The surface 13A of the insulating layer 13 is formed so that the surface 13A is flush with the surface 12A of each connection terminal 12.

A photosensitive material or a material having no photosensitivity may be used as the material the insulating layer 13. Examples of the material of the insulating layer 13 may include a sheet-like insulating resin in B-stage state (or semi-cured state) with adhesion properties (for example, an NCF (non-conductive film)), a paste-like insulating resin (for example, an NCP (non-conductive paste)), a sheet-like anisotropic conductive resin with adhesion properties (for example, an ACF (anisotropic conductive film)), a paste-like anisotropic conductive resin (for example, an ACP (anisotropic conductive paste)), a build-up resin (an epoxy resin with a filler or an epoxy resin without filler), a liquid crystal polymer, etc. For example, the insulating layer 13 may be formed to have a thickness T2 on the order of 10 to 60 micrometers.

The insulating layer 41 is provided to cover the side surfaces of the semiconductor device 10. In the insulating layer 41, a recess 41X is formed. For example, the recess 41X may be configured into the shape of an inverted truncated cone having a maximum opening portion (on the side of the solder resist layer 16) with a diameter larger than a diameter of the bottom surface thereof. However, the shape of the recess 41X is not limited to the shape of an inverted truncated cone in this embodiment. Alternatively, the recess 41X may be formed in a hemispherical shape or a cylindrical shape. For example, when the recess 41X is formed in the shape of an inverted truncated cone, the diameter of the maximum opening portion and a diameter of the bottom surface may be on the order of 100 to 500 micrometers. For example, the recess 41X may be formed to have a depth on the order of 50 to 250 micrometers.

The insulating layer 41 is provided as a part of the base material used when the wiring pattern 14 is formed. A resin material, such as an epoxy resin or a polyimide resin, may be used as the material of the insulating layer 41.

The wiring pattern 14 is formed on the surface 13A of the insulating layer 13 and on the surface 41A of the insulating layer 41 (including the inside of the recess 41X) so that the wiring pattern 14 is in contact with the surface 12A of the connection terminal 12. In the following, the portion of the wiring pattern 14 formed in the recess 41X of the wiring pattern 14 will be referred to as recess 14X. The shape of the recess 14X is in conformity with the shape of the recess 41X.

The wiring pattern 14 is electrically connected to the semiconductor integrated circuit 22 through the connection terminals 12 and the electrode pads 23. The wiring pattern 14 may be called rewiring pattern. The wiring pattern 14 is formed to electrically connect the electrode pads 23 and the external connection terminals 17, both of which are formed to have pitches that are different from each other.

The wiring pattern 14 includes a metal layer 26 and a metal layer 27. For example, a Cu layer, a laminated metal layer made up of a Cu layer and a Cr layer, a laminated metal layer made up of a Cu layer and a Ti layer, etc. may be used as the metal layer 26. Alternatively, the metal layer 26 may be a Cu layer formed by the electroless plating method, or a metallic thin film layer formed by the vacuum deposition method, the coating method, the chemical vapor deposition (CVD) method, or any combination of the above-mentioned metal layer forming methods. For example, the metal layer 26 may be formed to have a thickness T6 of about 2 micrometers. For example, a Cu layer or the like may be used as the metal layer 27. For example, the metal layer 27 may be formed to have a thickness T7 of about 10 micrometers.

The solder resist layer 16 is formed to cover the wiring pattern 14, the surface 13A of the insulating layer 13, and the surface 41A of the insulating layer 41. The solder resist layer 16 includes an opening 16X in which the bottom of the recess 14X in the wiring pattern 14 is partially exposed. The solder resist layer 16 is a protective layer of polymer that provides a permanent protective coating for the wiring pattern and prevents the wiring pattern from bridging between conductors, thereby preventing short circuits. For example, the material of the solder resist layer 16 may be a photo-imageable resin material.

The external connection terminal 17 is fixed to the bottom of the recess 14X in the wiring pattern 14 which is exposed in the opening 16X of the solder resist layer 16. A portion of the external connection terminal 17 is in contact with the surface of the solder resist layer 16 (including the inside surface of the opening 16X) but the external connection terminal 17 is not fixed to the solder resist layer 16. The external connection terminal 17 is electrically connected to the wiring pattern 14.

For example, the external connection terminal 17 is an electrode terminal which is electrically connected to a pad provided on a mounting board (not shown), such as a mother board. For example, a solder bump or the like may be used as the external connection terminal 17. For example, the material of the external connection terminal 17 may be one of an alloy containing Pb, an alloy of Sn and Cu, an alloy of Sn and Ag, an alloy of Sn, Ag and Cu, etc. Alternatively, a solder ball (Sn-3.5Ag) using a resin material (for example, divinylbenzene) as a core thereof may be used as the external connection terminal 17. The external connection terminal 17 is of the fan-out type. The external connection terminal 17 is disposed in a region of the semiconductor-device mounted board 20 which is located outside the region where the semiconductor device 10 is mounted.

Accordingly, the external connection terminal 17 is fixed only to the bottom of the recess 14X in the wiring pattern 14 and the portion of the external connection terminal 17 which touches the solder resist layer 16 is freely movable. Hence, when the semiconductor-device mounted board 20 is implemented in and connected to the mounting board, such as a mother board, and the respective coefficients of thermal expansion of the semiconductor-device mounted board 20 and the mounting board differ from each other, the internal stresses or residual stresses which may arise due to the difference in the coefficient of thermal expansion may be reduced. In addition, the recess 14X is formed in the wiring pattern 14 and the volume of the material which constitutes the external connection terminal 17 is increased, so that the ability to reduce the internal stresses or residual stresses may be improved.

If the size of the portion of the external connection terminal 17 projecting from the surface of the solder resist layer 16 is increased in order to increase the volume of the material which constitutes the external connection terminal 17, then the ability to reduce the internal stresses or residual stresses would be improved. However, there is a problem in that it is difficult to reduce the pitch of the external connection terminals 17 because of the increased size of each external connection terminal 17 in such a case. In this embodiment, the recess 14X is formed in the wiring pattern 14 and the volume of the material which constitutes the external connection terminal 17 is increased without increasing the size of the portion of the external connection terminal 17 projecting from the surface of the solder resist layer 16. Hence, in this embodiment, the problem that it is difficult to reduce the pitch of the external connection terminals 17 does not arise.

Next, a manufacturing method of the semiconductor-device mounted board of the first embodiment will be described.

FIGS. 2 to 19 are diagrams for explaining the manufacturing method of the semiconductor-device mounted board of the first embodiment. In FIGS. 2 to 19, the elements which are the same as corresponding elements of the semiconductor-device mounted board 20 shown in FIG. 1 are designated by the same reference numerals, and a description thereof will be omitted.

In FIGS. 2-11, "C" denotes the position of a dicing line along which the semiconductor substrate 31 is cut into pieces by a dicing blade (which will be referred to as "substrate cut position C"), "A" denotes a semiconductor device forming region (which will be referred to as "semiconductor device forming region A"), and "B" denotes a scribe region (which will be referred to as "scribe region B"), including the substrate cut position C, by which two adjacent ones of a plurality of semiconductor device forming regions A are separated from each other.

Figure 2:
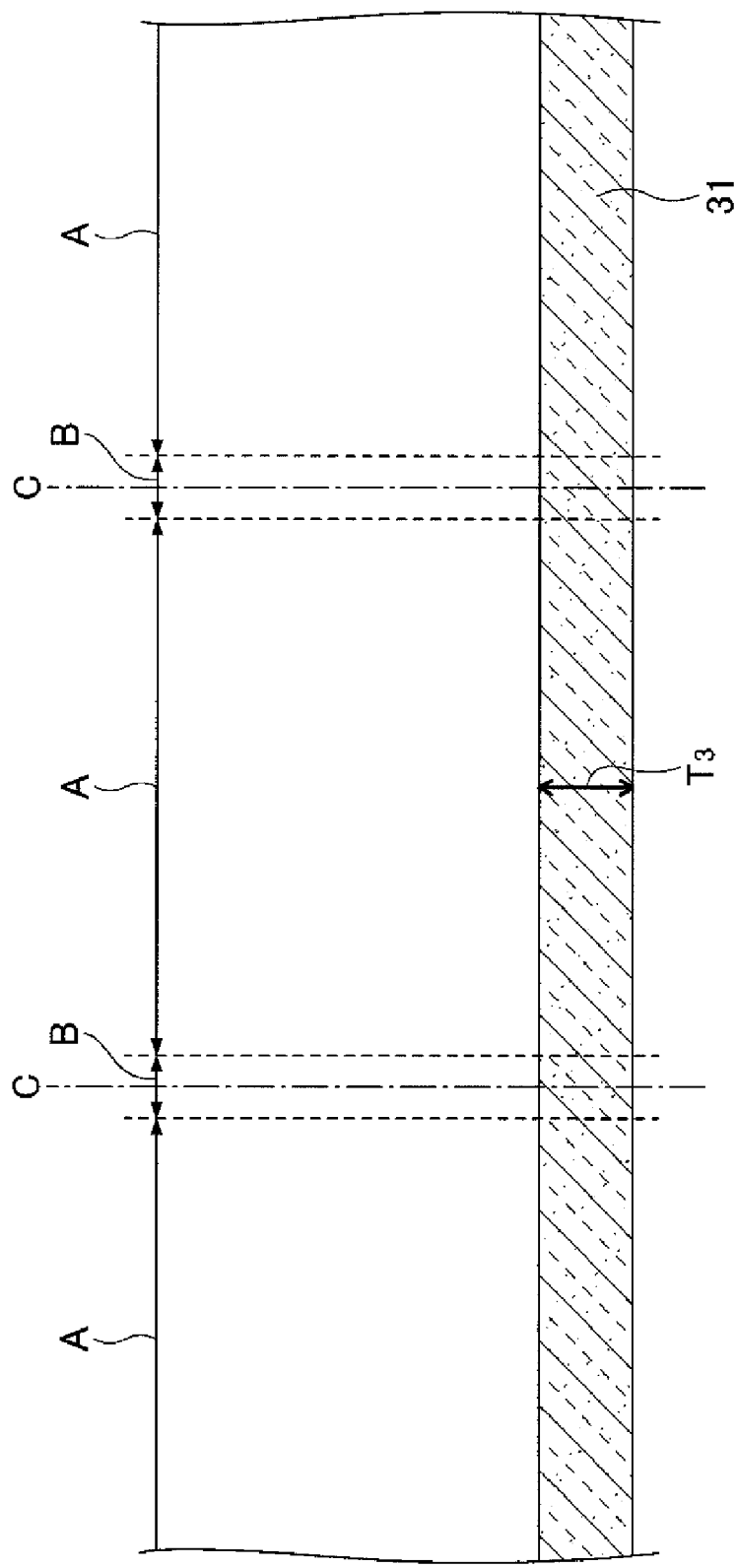
FIG. 2 is a diagram for explaining a manufacturing method of the semiconductor-device mounted board of the first embodiment.
Figure 3:
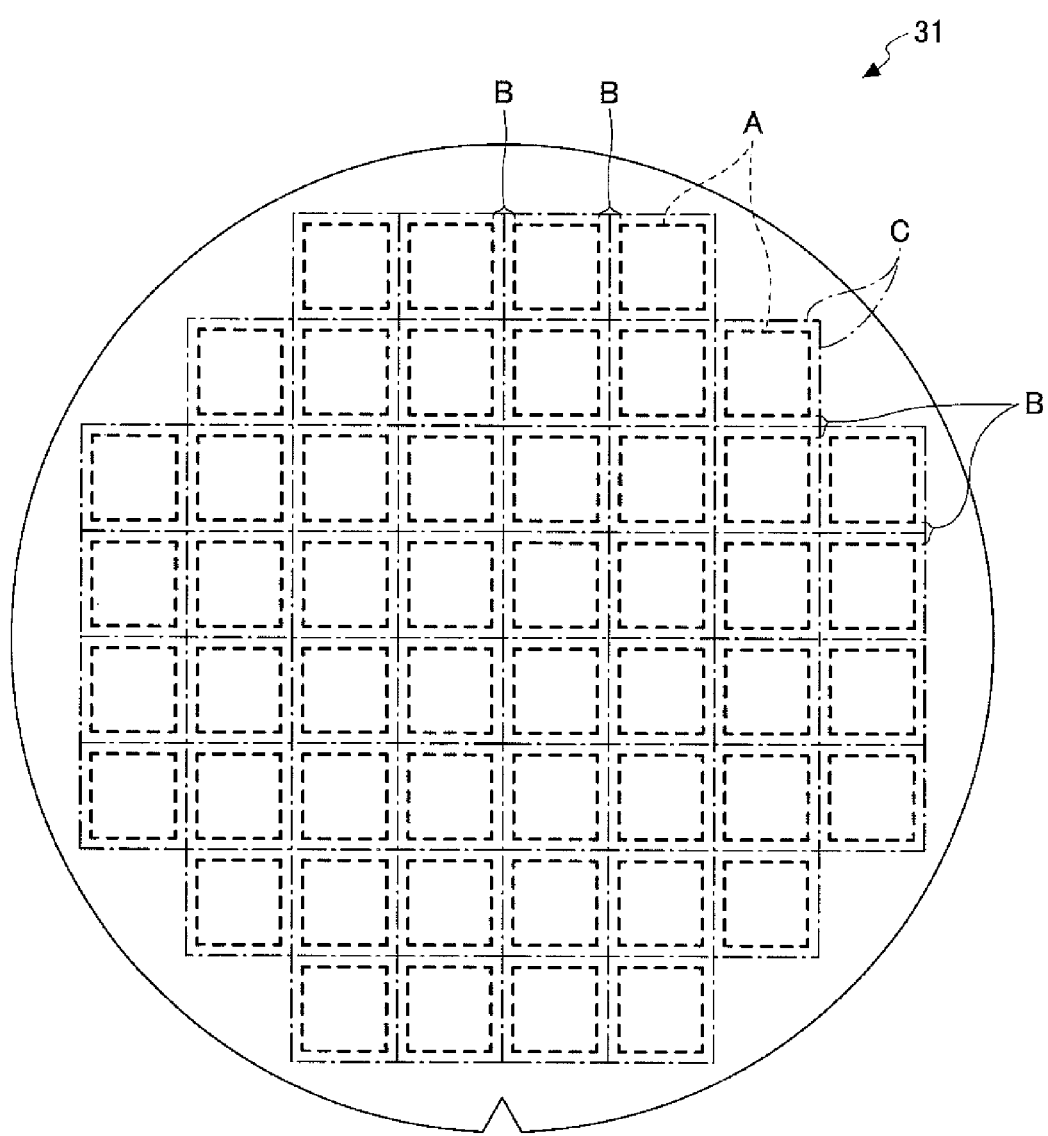
FIG. 3 is a diagram for explaining the manufacturing method of the semiconductor-device mounted board of the first embodiment.

First, at the step shown in FIG. 2 and FIG. 3, a semiconductor substrate 31 which includes a plurality of semiconductor device forming regions A and a plurality of scribe regions B, each including a corresponding substrate cut position C and separating two adjacent ones of the plurality of semiconductor device forming regions A from each other, is prepared. FIG. 2 is a cross-sectional view of the semiconductor substrate 31. FIG. 3 is a plan view of the semiconductor substrate 31.

The semiconductor substrate 21 (previously described with reference to FIG. 1) is formed from the semiconductor substrate 31 as shown in FIGS. 2 and 3. Namely, the semiconductor substrate 31 is formed to have a small thickness and cut at the substrate cut positions C into pieces (the semiconductor substrates 21).

For example, a silicon wafer may be used as the semiconductor substrate 31. The semiconductor substrate 31 may have a thickness T3 on the order of 500 to 775 micrometers.

Figure 4:
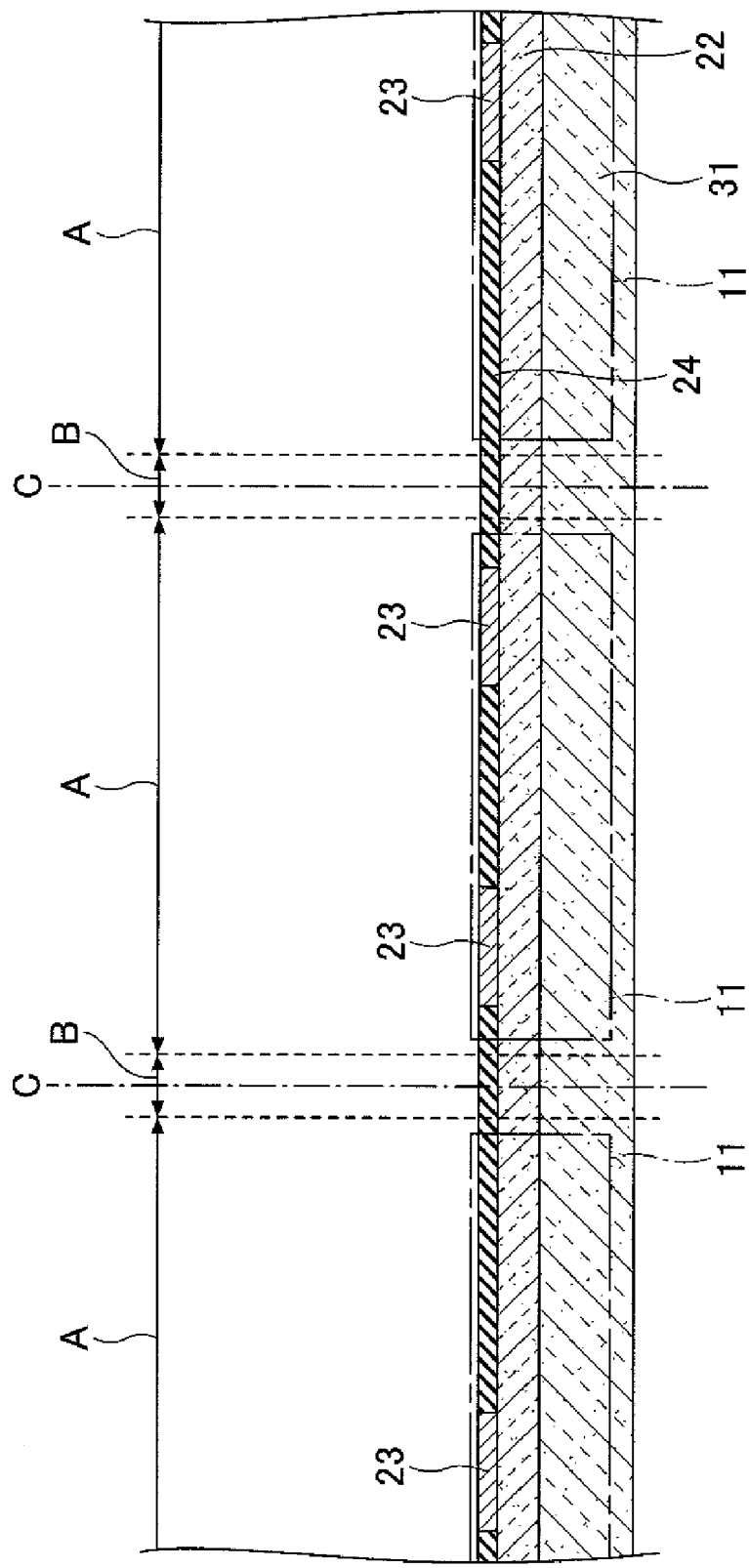
FIG. 4 is a diagram for explaining the manufacturing method of the semiconductor-device mounted board of the first embodiment.

Subsequently, at the step shown in FIG. 4, a semiconductor chip 11 which includes a semiconductor integrated circuit 22, electrode pads 23, and a protection film 24 is formed on one surface of the semiconductor substrate 31 in the region corresponding to the semiconductor device forming region A by using the known method.

As the material of the electrode pads 23, aluminum or the like may be used. Alternatively, a multi-layered material in which an aluminum layer is deposited on a copper layer, or a multi-layered material in which an aluminum layer is deposited on a silicon layer which is further deposited on a copper layer may be used as the material of the electrode pads 23. For example, a SiN film, a PSG film, etc. may be used as the material of the protection film 24. Alternatively, a polyimide film may be laminated on the layer of the protection film 24 which is made of a SiN film or a PSG film.

Subsequently, at the step shown in FIG. 5, the connection terminals 12 are respectively formed on the electrode pads 23 provided in each semiconductor device forming region A. For example, each connection terminal 12 may be formed from an Au bump, an Au plating film, or a metallic film containing a Ni film formed by the electroless plating method or the like and an Au film formed to cover the Ni film. For example, Au bumps may be formed with a bonding wire using a wire bonding machine. Alternatively, Au bumps may be formed by the plating method. The connection terminals 12 formed at the step shown in FIG. 5 may have different heights.

Figure 6:
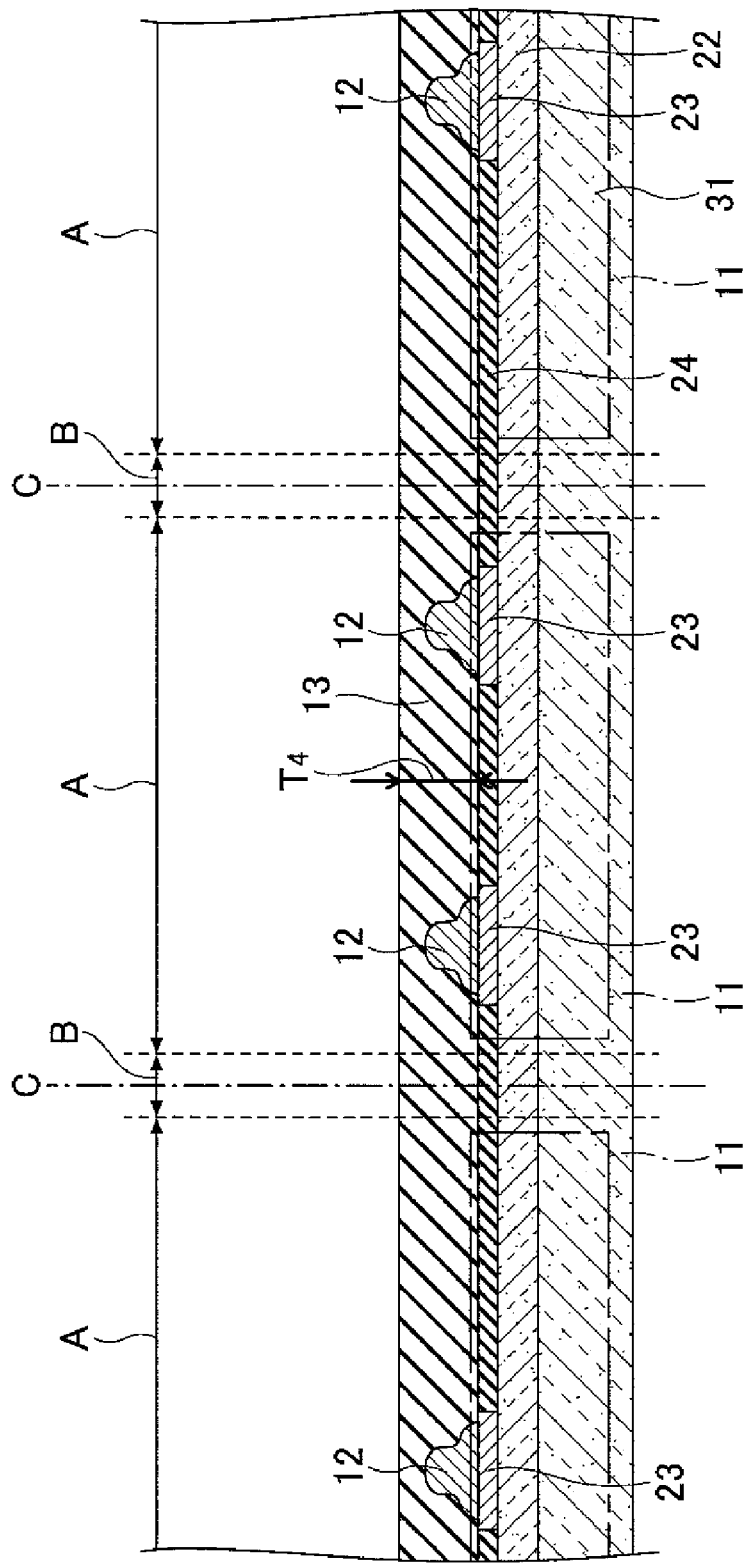
FIG. 6 is a diagram for explaining the manufacturing method of the semiconductor-device mounted board of the first embodiment.

Subsequently, at the step shown in FIG. 6, the insulating layer 13 is formed to cover the semiconductor chips 11 and the connection terminals 12. As the material of the insulating layer 13, a photosensitive material or a material having no photosensitivity may be used. Examples of the material of the insulating layer 13 may include a sheet-like insulating resin in B-stage state (or semi-cured state) with adhesion properties (for example, an NCF (non-conductive film)), a paste-like insulating resin (for example, an NCP (non-conductive paste)), a sheet-like anisotropic conductive resin with adhesion properties (for example, an ACF (anisotropic conductive film)), a paste-like anisotropic conductive resin (for example, an ACP (anisotropic conductive paste)), a build-up resin (an epoxy resin with a filler or an epoxy resin without filler), a liquid crystal polymer, etc.

Figure 5:
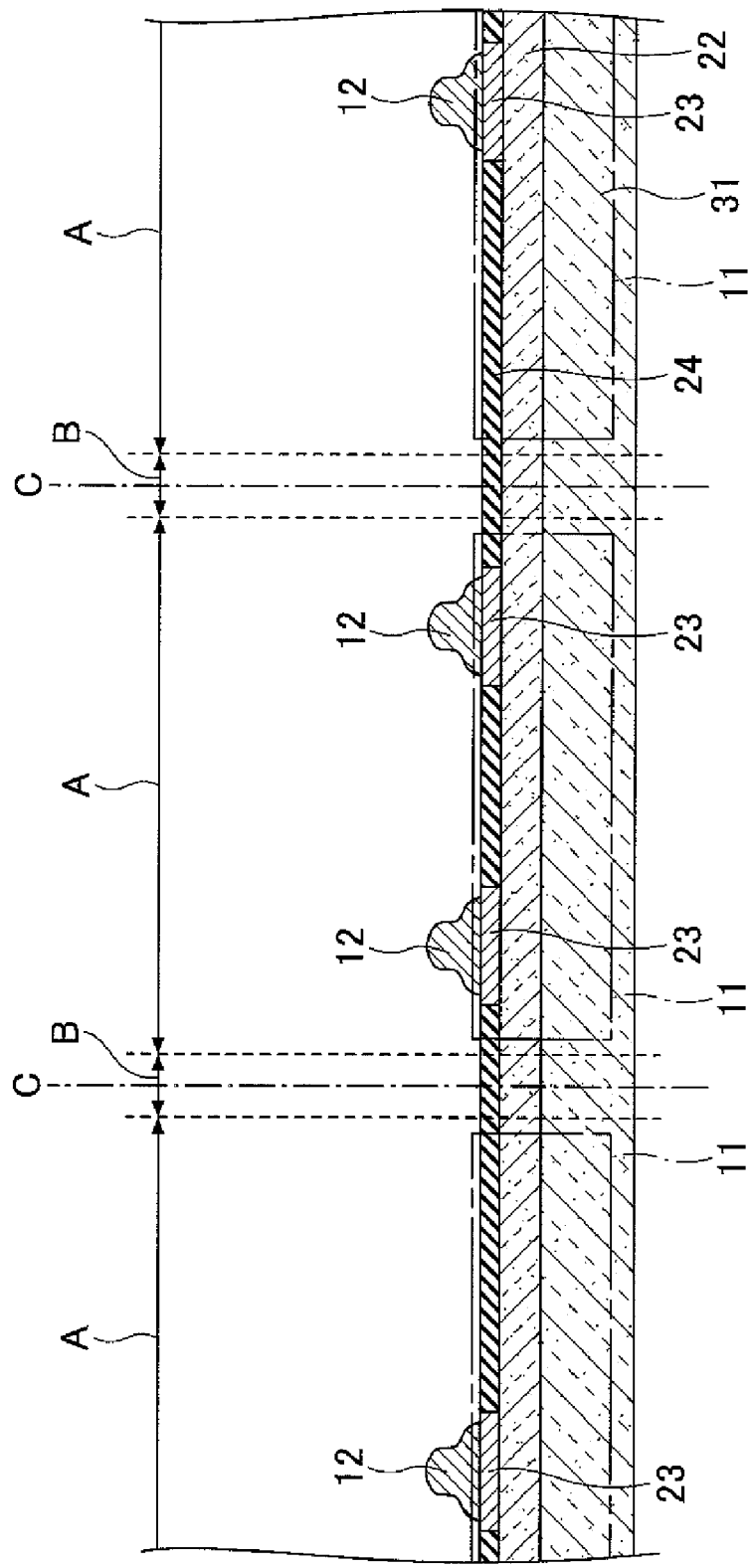
FIG. 5 is a diagram for explaining the manufacturing method of the semiconductor-device mounted board of the first embodiment.

When a sheet-like insulating resin with adhesion properties is used as the insulating layer 13, the sheet-like insulating resin is stuck on one surface of the structure shown in FIG. 5. When a paste-like insulating resin is used as the insulating layer 13, the paste-like insulating resin is formed on one surface of the structure shown in FIG. 5 by the printing method or the like, and thereafter the insulating resin is pre-baked so that the insulating resin is in the semi-cured state. The insulating resin in the semi-cured state has adhesive property. The insulating layer 13 may have a thickness T4 on the order of 20 to 100 micrometers, for example.

Subsequently, at the step shown in FIG. 7, a plate-like medium 25 is disposed on the surface 13A of the insulating layer 13. The plate-like medium 25 has a rough surface 25B on the side facing the surface 13A of the insulating layer 13. For example, the plate-like medium 25 may have a thickness T5 on the order of 10 micrometers. As the material of the plate-like medium 25, a metallic foil, such as a Cu foil, may be used. Alternatively, a temporary film which is made of a PET (polyethylene terephthalate) or the like may be used as the material of the plate-like medium 25. Alternatively, a resin film with a copper foil attached to one surface of the resin film may be used as the material of the plate-like medium 25.

In the following, it is assumed that a metallic foil is used as the material of the plate-like medium 25, and the following steps of the manufacturing method will be described.

Figure 7:
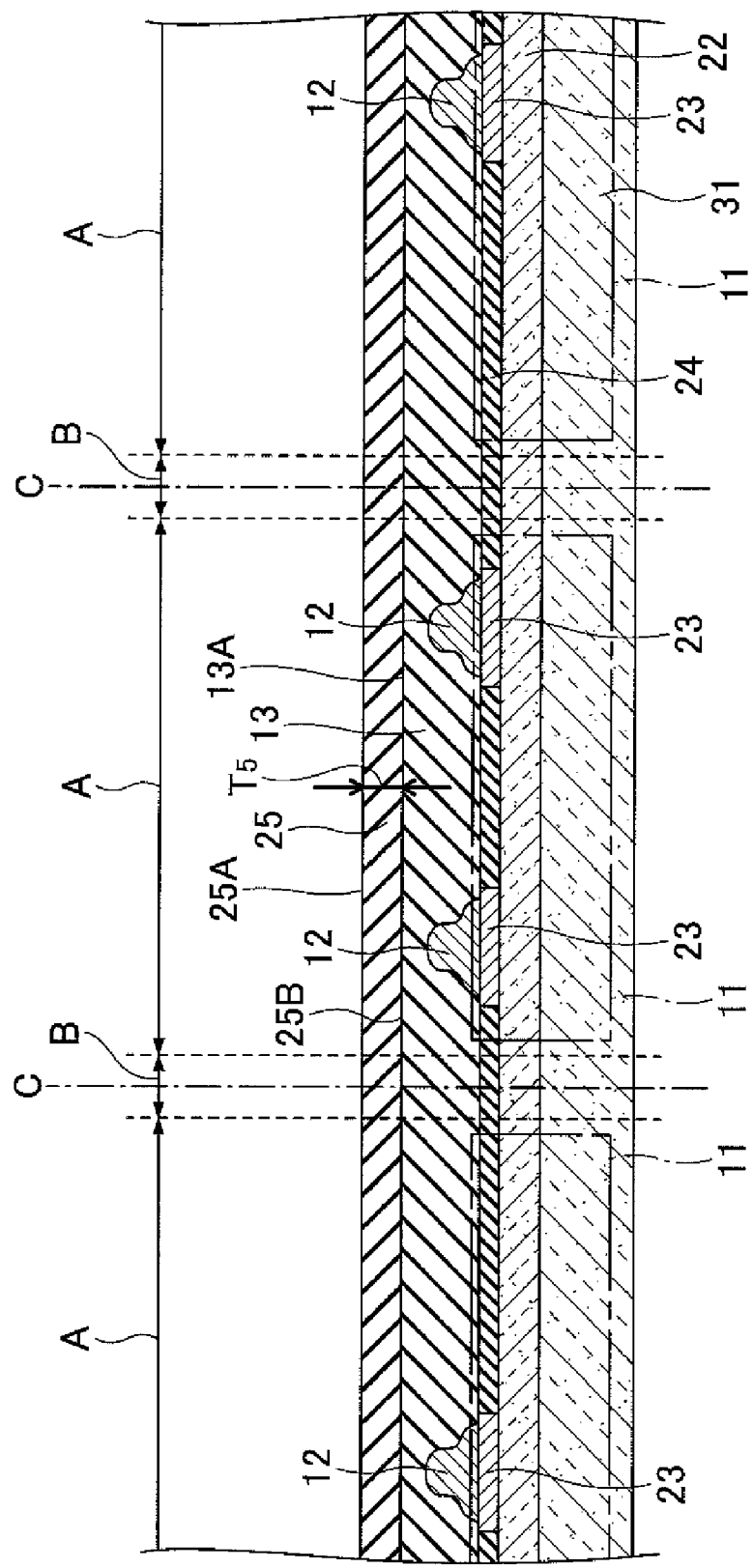
FIG. 7 is a diagram for explaining the manufacturing method of the semiconductor-device mounted board of the first embodiment.

Subsequently, at the step shown in FIG. 8, while the structure shown in FIG. 7 is heated, the plate-like medium 25 is pressed from the side of the surface 25A of the plate-like medium 25, so that the plate-like medium 25 is stuck to the insulating layer 13 by pressure. Thereby, the insulating layer 13 is compressed and the surface 12A of the connection terminal 12 is exposed from the surface 13A of the insulating layer 13. The rough surface 25B of the plate-like medium 25 is transferred to the surface 13A of the insulating layer 13. The insulating layer 13 is cured by the heating of the structure shown in FIG. 7. The insulating layer 13 after the sticking by pressure may have a thickness T2 on the order of 10 to 60 micrometers, for example.

Figure 8:
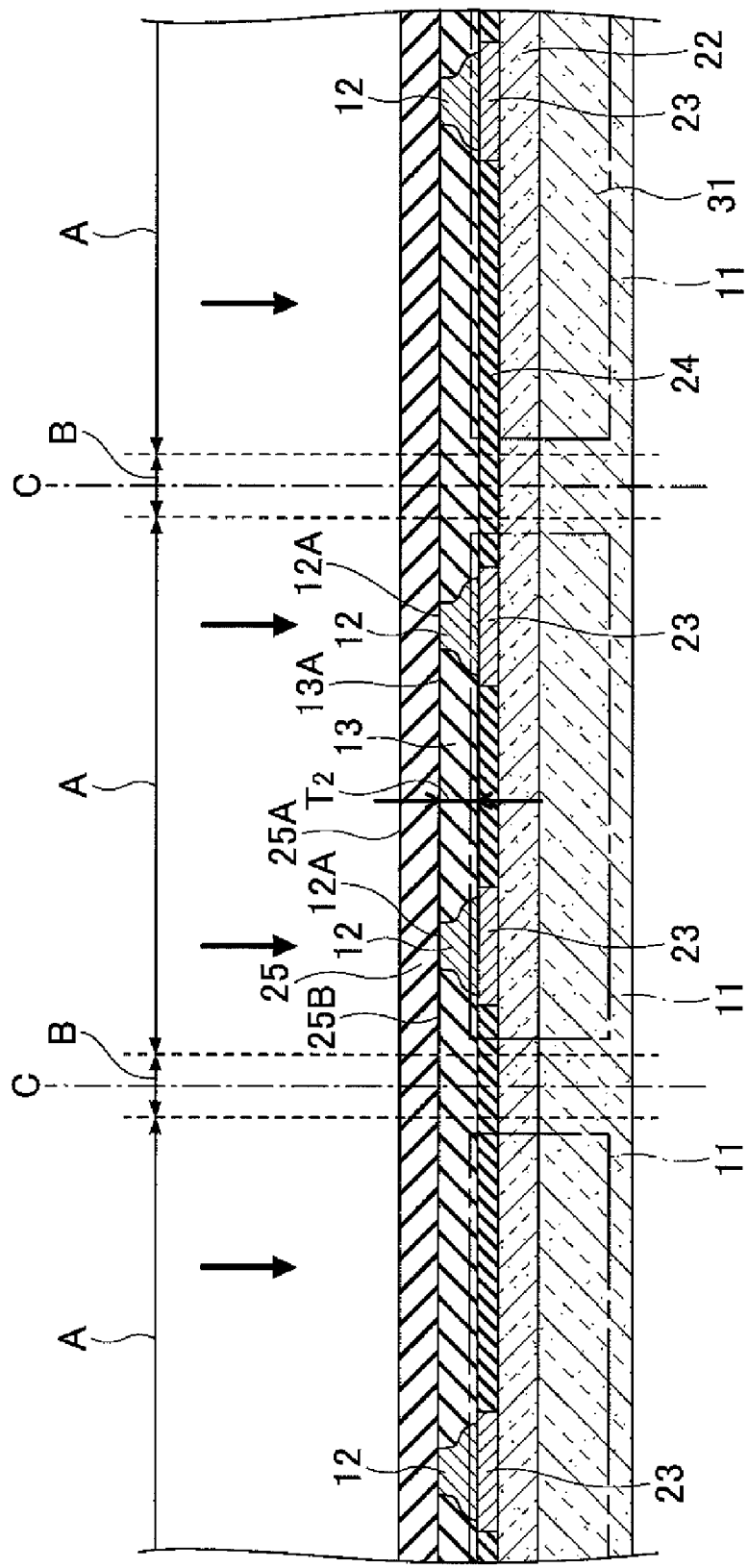
FIG. 8 is a diagram for explaining the manufacturing method of the semiconductor-device mounted board of the first embodiment.
Figure 9:
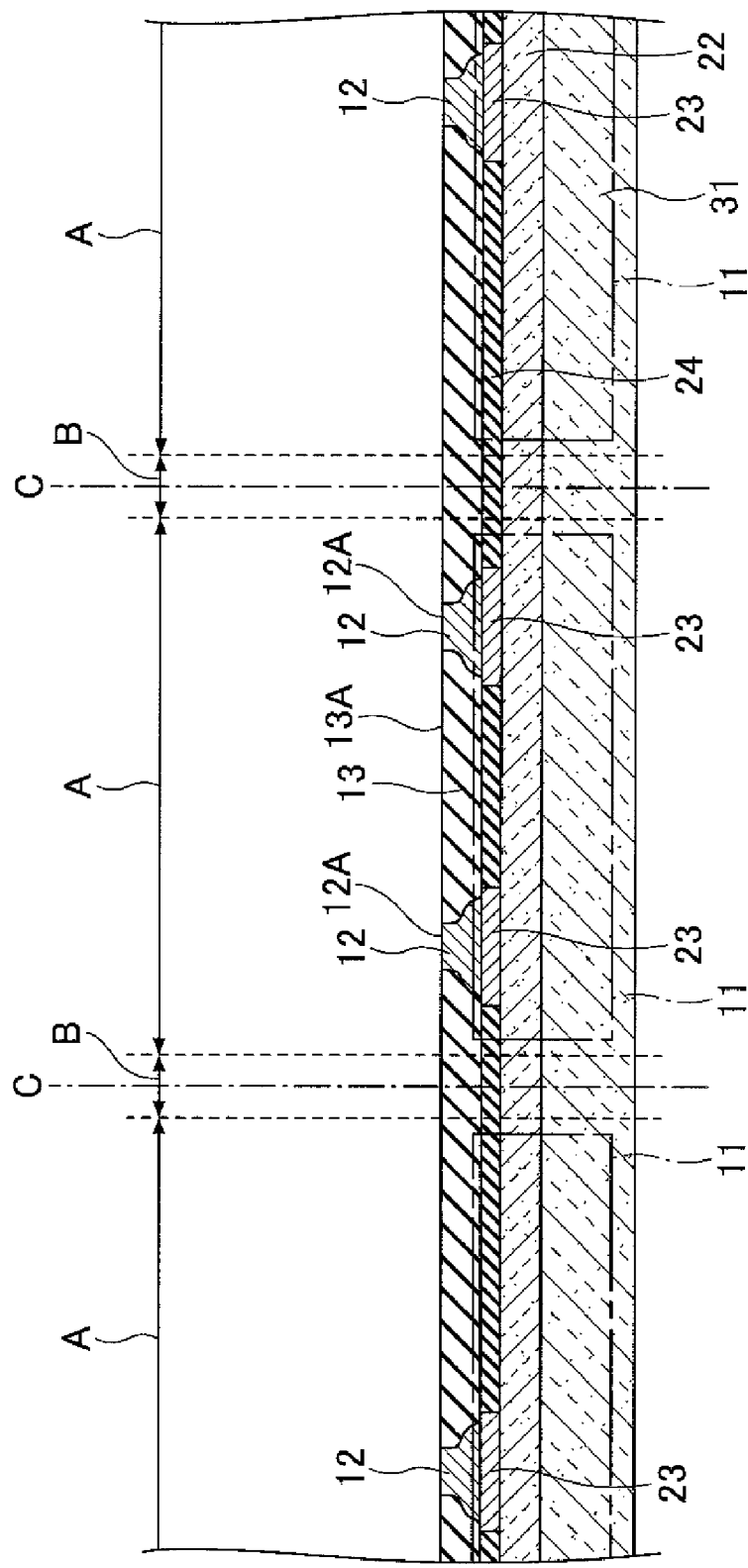
FIG. 9 is a diagram for explaining the manufacturing method of the semiconductor-device mounted board of the first embodiment.

Subsequently, at the step shown in FIG. 9, etching is performed to completely remove the plate-like medium 25 as shown in FIG. 8. Performing the steps shown in FIGS. 7 to 9 makes it possible to increase the adhesion of the metal layer 26 and the connection terminal 12 at the step shown in FIG. 15 which will be described below.

Figure 10:
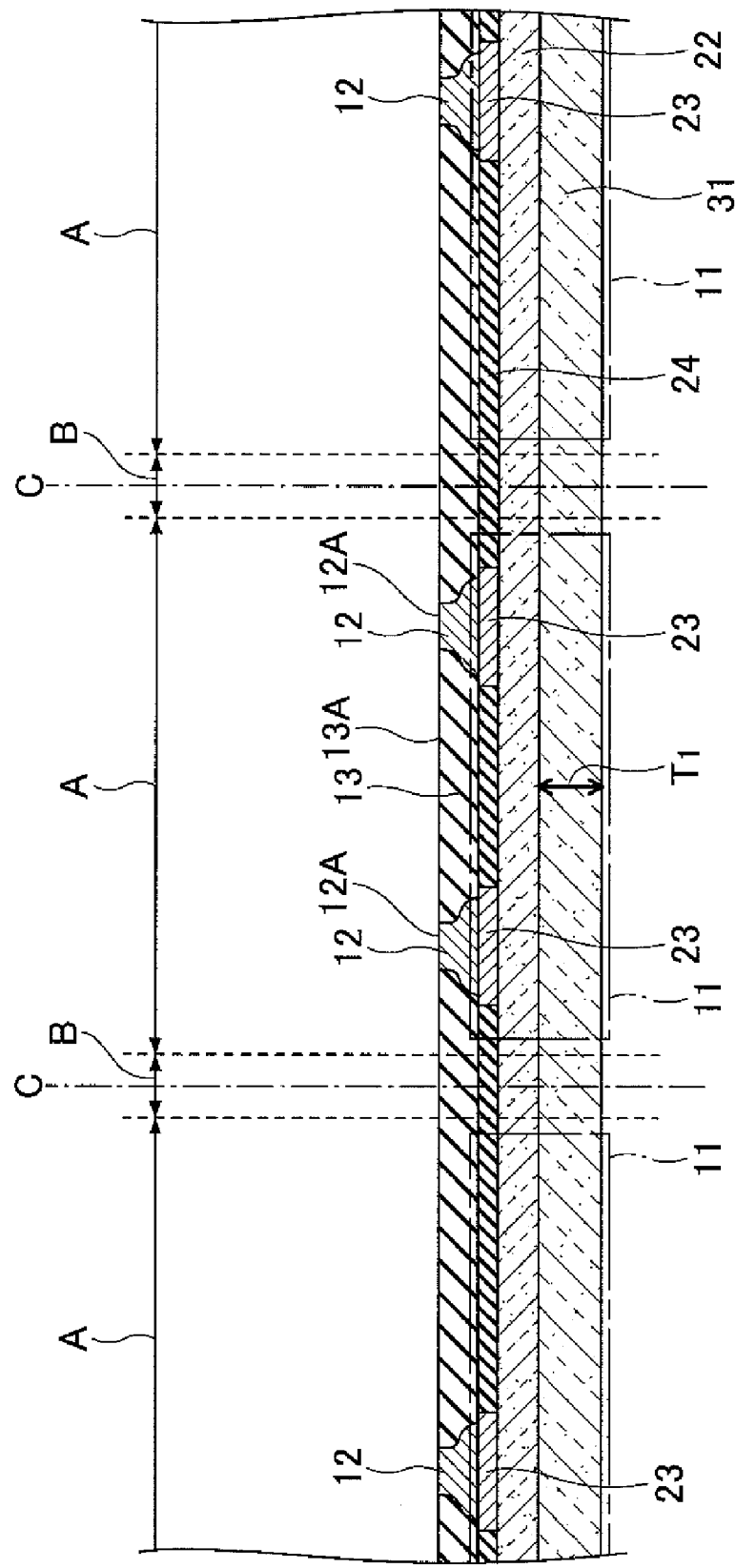
FIG. 10 is a diagram for explaining the manufacturing method of the semiconductor-device mounted board of the first embodiment.

Subsequently, at the step shown in FIG. 10, the semiconductor substrate 31 is ground from the side of the back surface of the semiconductor substrate 31, so that the semiconductor substrate 31 is formed to have a small thickness. For example, the back surface of the semiconductor substrate 31 may be ground using a back side grinder so that the semiconductor substrate 31 has a small thickness. The semiconductor substrate 31 after the grinding may have a thickness T1 on the order of 50 to 500 micrometers. Alternatively, the step shown in FIG. 10 may be omitted.

Figure 11:
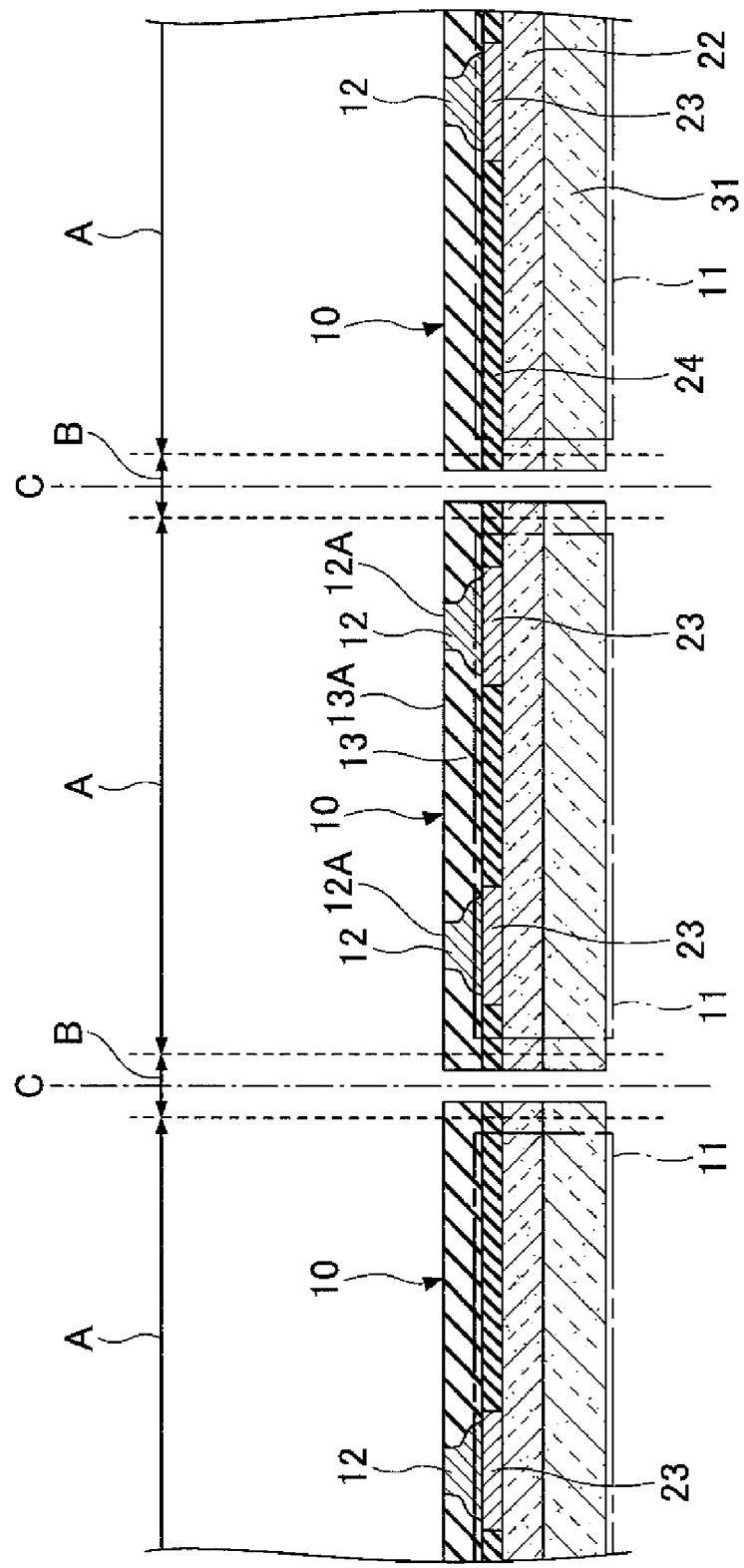
FIG. 11 is a diagram for explaining the manufacturing method of the semiconductor-device mounted board of the first embodiment.

Subsequently, at the step shown in FIG. 11, the semiconductor substrate 31 is cut at the substrate cut positions C in the regions corresponding to the scribe regions B so that a plurality of semiconductor devices 10 are produced. For example, the cutting of the semiconductor substrate 31 may be performed by dicing.

Figure 12:
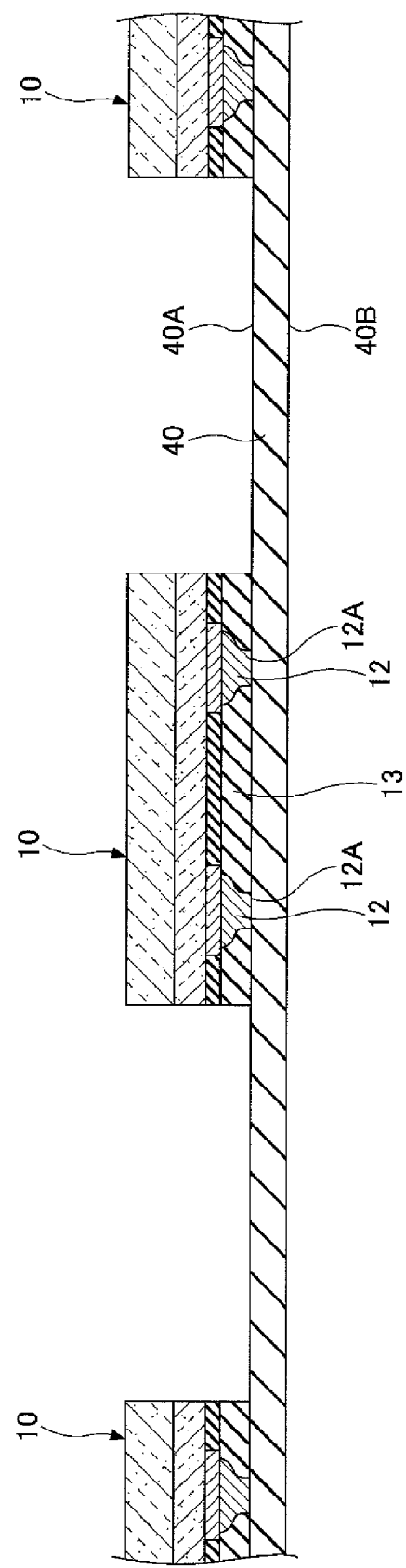
FIG. 12 is a diagram for explaining the manufacturing method of the semiconductor-device mounted board of the first embodiment.

Subsequently, at the step shown in FIG. 12, a first support medium 40 is prepared. The semiconductor devices 10 are disposed on the surface 40A of the first support medium 40 so that the surface 12A of each connection terminal 12 is in contact with the surface 40A of the first support medium 40. For example, the surface 40A of the first support medium 40 has adhesion properties, and the disposed semiconductor devices 10 are temporarily fixed. If the surface 40A of the first support medium 40 has no adhesion properties, the disposed semiconductor devices 10 may be temporarily fixed by using, for example, an adhesive tape.

As the material of the first support medium 40, a PET film, a polyimide film, a metallic foil, etc. may be used. In a case in which a PET film or a polyimide film is used as the material of the first support medium 40, the first support medium 40 may have a thickness on the order of 10 to 100 micrometers. In a case in which a metallic foil (Cu foil) is used, the first support medium 40 may have a thickness on the order of 10 to 30 micrometers.

However, the material of the first support medium 40 is not limited to a PET film, a polyimide film, and a metallic foil. It should be noted that any other material may be used as the material of the first support medium 40 if the material is deformable at the positions corresponding to convex parts 42X of a second support medium 42 at the step shown in FIG. 13 which will be described below.

Figure 13:
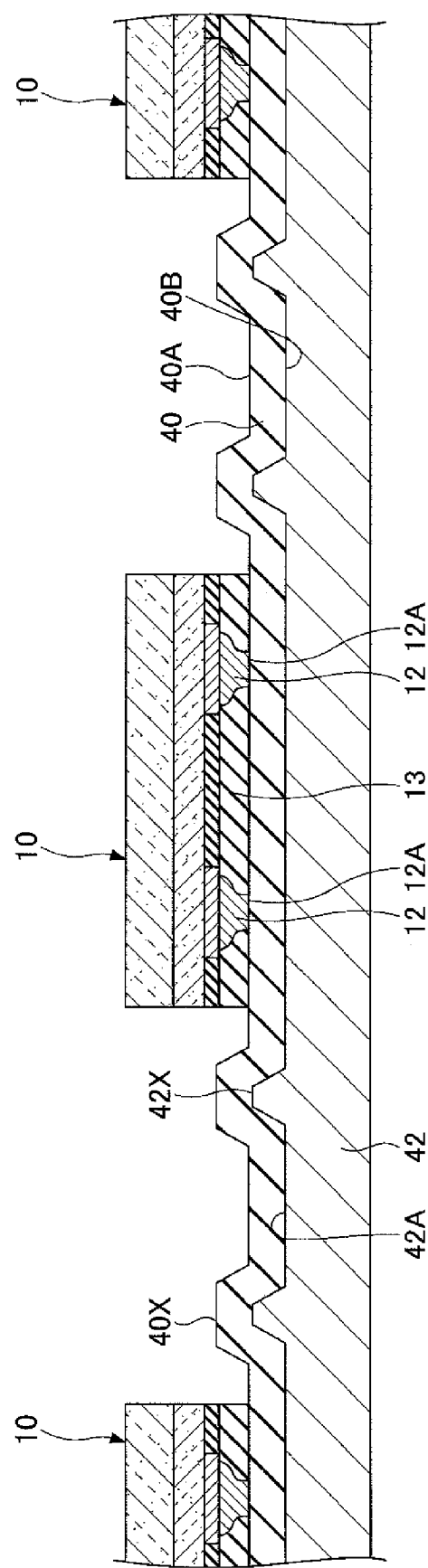
FIG. 13 is a diagram for explaining the manufacturing method of the semiconductor-device mounted board of the first embodiment.

Subsequently, at the step shown in FIG. 13, a second support medium 42 in which a plurality of convex parts 42X are formed on the surface 42A thereof is prepared. For example, as the second support medium 42, a metallic mold or a ceramics mold may be used. The structure shown in FIG. 12 is disposed on the surface 42A of the second support medium 42 so that the surface 40B of the first support medium 40 is in contact with the surface 42A of the second support medium 42. By using the second support medium 42 as a mold and applying vacuum pressure, the structure shown in FIG. 12 is pneumatically attracted and temporarily fixed to the surface 42A of the second support medium 42 under pressure. Thereby, the first support medium 40 is partially deformed and the convex parts 40X corresponding to the convex parts 42X of the second support medium 42 are formed.

The shape of each convex part 40X is transferred to the insulating layer 41 and the recess 41X in the insulating layer 41 is formed at the step shown in FIG. 15 which will be described below. For example, the shape of each convex part 40X may be a truncated cone shape. However, the shape of each convex part 40X is not limited to the truncated cone shape. Alternatively, each convex part 40X may be formed in a hemispherical shape or a cylindrical shape. When each convex part 40X is in the shape of a truncated cone, both a diameter of the top surface of the truncated cone of the convex part 40X and a diameter of the bottom surface thereof may be on the order of 100 to 500 micrometers. The convex part 40X may have a height on the order of 50 to 250 micrometers.

Each convex part 40X has the shape that is in conformity with the shape of a corresponding convex part 42X, and when it is desired to form each convex part 40X in a truncated cone shape, it is necessary to form each convex part 42X in a truncated cone shape. When each convex part 42X is formed in a truncated cone shape, a diameter of the top surface of the truncated cone, a diameter of the bottom surface of the truncated cone, and a height of the truncated cone may be determined by taking into consideration of the thickness and others of the first support medium 40 after the desired dimensions of each convex part 40X are determined. In the following, an example in which the shape of the convex parts 40X and 42X is a truncated cone shape will be described.

Subsequently, at the step shown in FIG. 14, the insulating layer 41 is formed on the surface 40A of the first support medium 40 to cover the side surfaces of each semiconductor device 10. As the material of the insulating layer 41, a resin material, such as an epoxy resin or a polyimide resin, may be used. A typical method of forming the insulating layer 41 is as follows. A resin film, such as an epoxy resin or a polyimide resin, is deposited on the surface 40A of the first support medium 40, and the resin film is pressed down on the surface 40A and then heat-treated at a temperature of about 190 degrees C., for example, so that the resin film is cured and the insulating layer 41 may be produced.

An alternative method of forming the insulating layer 41 is as follow. A liquefied resin material, such as an epoxy resin or a polyimide resin, is applied to the surface 40A of the first support medium 40. Thereafter, the resin material is heat-treated at a temperature of about 190 degrees C., for example, so that the resin material is cured and the insulating layer 41 may be produced.

Figure 14:
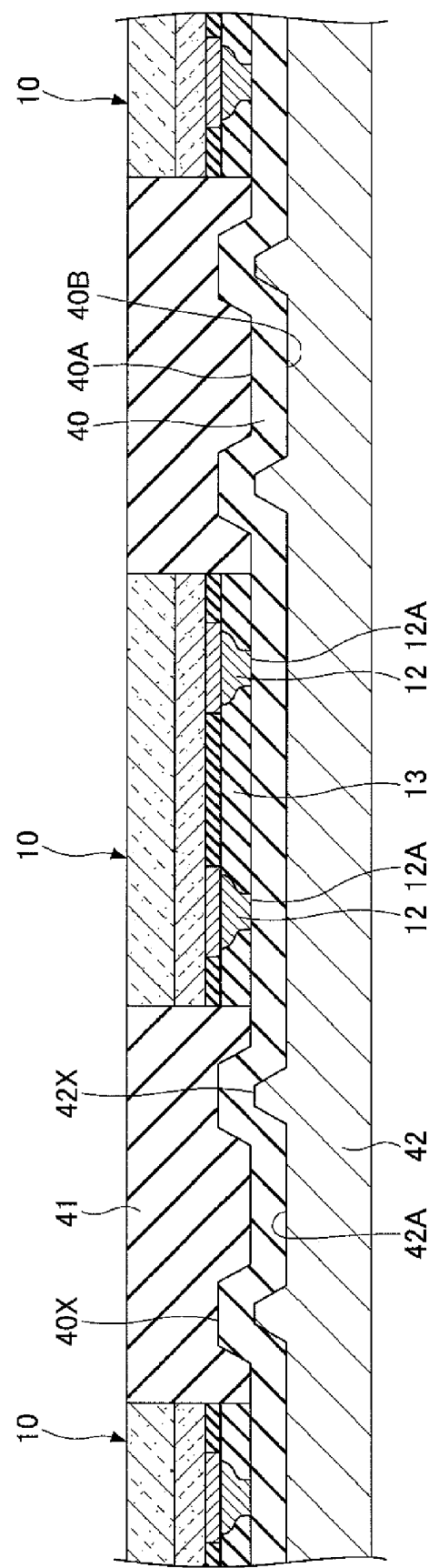
FIG. 14 is a diagram for explaining the manufacturing method of the semiconductor-device mounted board of the first embodiment.

Subsequently, at the step shown in FIG. 15, the application of the vacuum pressure to attract the first support medium 40 to the second support medium 42 as shown in FIG. 14 is canceled, and then the first support medium 40 is removed. Thereby, the shape of each convex part 40X is transferred to the insulating layer 41 and the recess 41X in the insulating layer 41 is formed. Each recess 41X is formed in a truncated cone shape corresponding to the shape of each convex part 40X. Subsequently, at the step shown in FIG. 16, the wiring pattern 14 which includes the metal layer 26 and the metal layer 27 is formed on the surface 13A of the insulating layer 13 and on the surface 41A of the insulating layer 41 (including the inside surface of each recess 41X), so that the wiring pattern 14 is in contact with the surface 12A of each connection terminal 12. Each recess 14X in the wiring pattern 14 is the portion of the wiring pattern 14 formed on the inside surface of a corresponding recess 41X of the insulating layer 41. The wiring pattern 14 is electrically connected to the semiconductor integrated circuit 22 through the connection terminals 12 and the electrode pads 23. For example, the wiring pattern 14 may have a thickness of about 12 micrometers. The illustration of the structure in FIG. 16 is given by turning the structure of FIG. 15 upside down, and the shape of each recess 41X in the structure of FIG. 16 is an inverted truncated cone shape.

A typical method of forming the wiring pattern 14 is as follows. First, the metal layer 26 is formed on the surface 13A of the insulating layer 13 and on the surface 41A of the insulating layer 41 (the inside of recess 41X is also included) by sputtering. The metal layer 26 and the connection terminals 12 are electrically connected to each other. For example, a Cu layer, a laminated metal layer made up of a Cu layer and a Ti layer, a laminated metal layer made up of a Cu layer and a Cr layer, etc. may be used as the metal layer 26. Alternatively, the metal layer 26 may be a Cu layer formed by the electroless plating method, or a metallic thin film layer formed by the vacuum deposition method, the coating method, the chemical-vapor-deposition (CVD) method, or any combination of the above-mentioned metal layer forming methods. For example, the metal layer 26 may have a thickness T6 of about 2 micrometers.

Second, the metal layer 27 is formed to cover the surface of the metal layer 26 by the electrolytic plating method using the metal layer 26 as the electricity supplying layer. For example, a Cu layer or the like may be used as the metal layer 27. For example, the metal layer 27 may have a thickness T7 of about 10 micrometers.

Third, a resist is applied to the surface of the metal layer 27, and a resist layer is formed in the upper part of the portion of the metal layer 27 corresponding to the region where the wiring pattern 14 is formed, by subjecting the resist to exposure and development according to the photolithographic method.

Finally, the metal layer 26 and the metal layer 27 are etched by using the resist layer as a mask, and the wiring pattern 14 is formed by removing the portions of the metal layer 26 and the metal layer 27 in which the resist layer is not formed. Then, the resist layer is removed. Thereafter, roughening treatment of the surface of the wiring pattern 14 is performed. The roughening treatment of the surface of the wiring pattern 14 may be performed according to the known method, such as blackening treatment or roughening etching. The roughening treatment is performed in order to improve the adhesion between the wiring pattern 14 and the solder resist layer 16 which will be formed on the upper and side surfaces of the wiring pattern 14.

Figure 17:
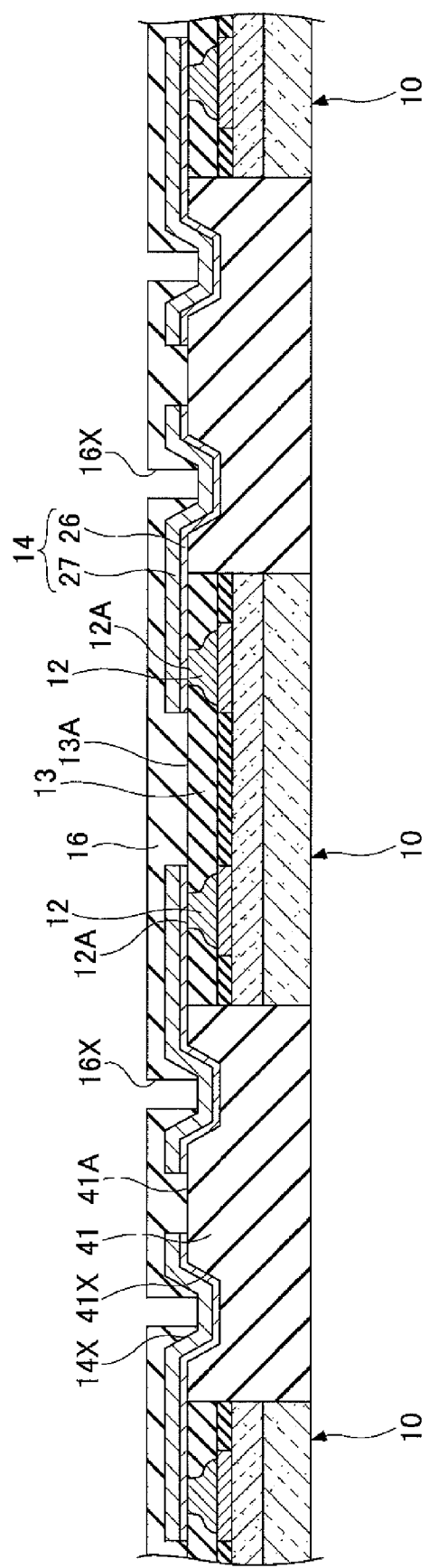
FIG. 17 is a diagram for explaining the manufacturing method of the semiconductor-device mounted board of the first embodiment.

Subsequently, at the step shown in FIG. 17, the solder resist layer 16, including the openings 16X in which the bottom of the recesses 14X of the wiring pattern 14 is partially exposed, is formed to cover the surface 13A of the insulating layer 13, the wiring pattern 14 and the surface 41A of the insulating layer 41. A typical method of forming the solder resist layer 16 is as follows. First, a photo-imageable resin material is applied to cover the surface 13A of the insulating layer 13, the wiring pattern 14 and the surface 41A of the insulating layer 41 (including the inside surface of each recess 41X). Second, the photo-imageable resin material is subjected to exposure and development according to the photolithographic method, and a part of the photo-imageable resin material is removed by etching so that the openings 16X in which the bottom of the recesses 14X of the wiring pattern 14 is partially exposed are formed.

Subsequently, at the step shown in FIG. 18, the external connection terminals 17 are formed so that the external connection terminals 17 are connected to the bottom of the recesses 14X of the wiring pattern 14 exposed in the openings 16X of the solder resist layer 16. Each external connection terminal 17 is fixed to the bottom of a corresponding recess 14X of the wiring pattern 14 exposed in the opening 16X of the solder resist layer 16. Although a part of the external connection terminal 17 touches the surface of the solder resist layer 16 (including the inside surface of the opening 16X), the external connection terminal 17 is not fixed to the solder resist layer 16. Each external connection terminal 17 is electrically connected to the wiring pattern 14.

For example, a solder bump may be used as each external connection terminal 17. For example, as the material of each external connection terminal 17, an alloy containing Pb, an alloy of Sn and Cu, an alloy of Sn and Ag, an alloy of Sn, Ag and Cu, etc. may be used. A solder ball (Sn-3.5Ag) using a resin (for example, divinylbenzene) as its core may also be used. At the step shown in FIG. 18, a plurality of structural components, each corresponding to the semiconductor-device mounted board 20, are formed.

Figure 18:
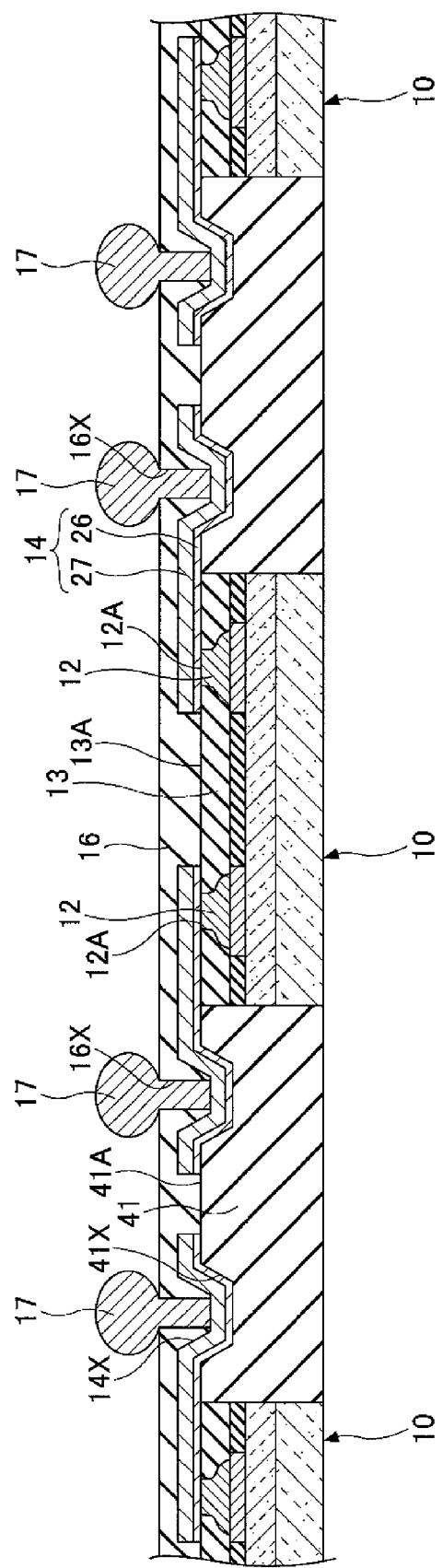
FIG. 18 is a diagram for explaining the manufacturing method of the semiconductor-device mounted board of the first embodiment.
Figure 19:
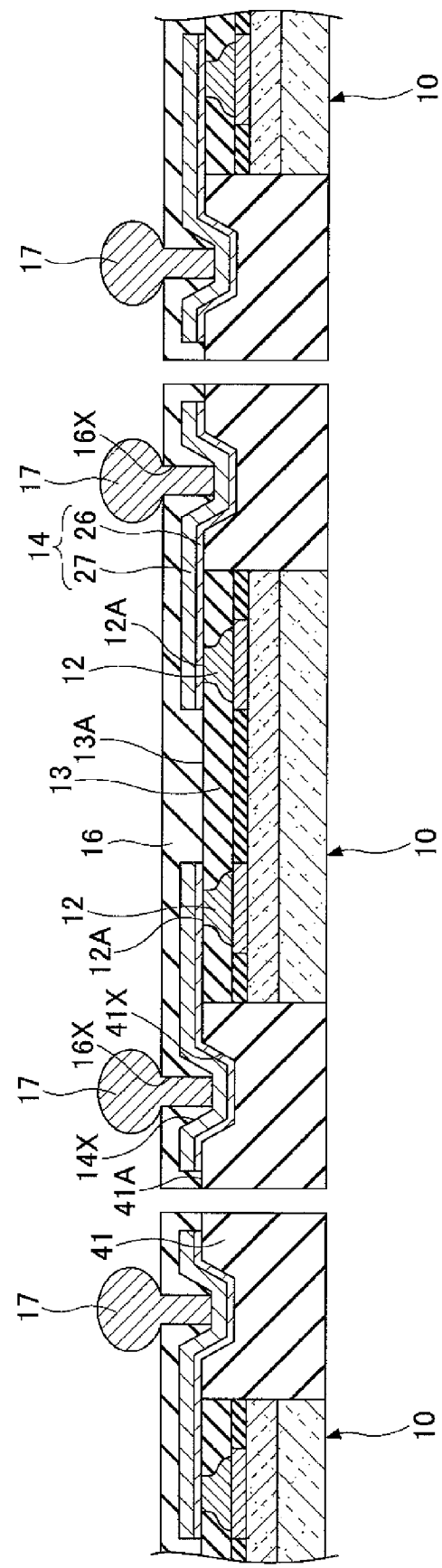
FIG. 19 is a diagram for explaining the manufacturing method of the semiconductor-device mounted board of the first embodiment.

Subsequently, at the step shown in FIG. 19, the structure shown in FIG. 18 is cut in the center of the insulating layer 41 into pieces, and the plurality of semiconductor-device mounted boards 20 are produced. For example, the cutting of the structure shown in FIG. 18 may be performed by dicing.

According to the manufacturing method of the semiconductor-device mounted board of the first embodiment, the semiconductor device 10 in which the surface 12A of each connection terminal 12 is exposed from the insulating layer 13 is produced. The insulating layer 41 is formed to cover at least the side surfaces of the semiconductor device 10. The wiring pattern 14 (re-wiring) is formed to be in contact with the surface 12A of each connection terminal 12 so that the wiring pattern 14 is electrically connected to the connection terminal 12. Consequently, it is unnecessary to perform the perforating of the insulating layer by a laser beam to make the connection terminal exposed from the insulating layer, and it is possible to prevent increasing of the manufacturing cost of the semiconductor-device mounted board 20.

It is unnecessary for the manufacturing method of the semiconductor-device mounted board of the first embodiment to perform the perforating of the insulating layer by a laser beam to make each connection terminal exposed from the insulating layer, and the interval between the connection terminals 12 is not restricted to the spot diameter of a laser beam (for example, about 70 micrometers). Consequently, it is possible to attain high-density formation of the connection terminals 12 to electrically connect the wiring pattern 14 (re-wiring) and the semiconductor integrated circuit 22 included in the semiconductor device 10. The interval between the connection terminals 12 may be reduced to the level equivalent to the L/S (line/space) of the wiring pattern (for example, 100 micrometers or less, or to 1 micrometer as the smallest possible interval).

In the manufacturing method of the semiconductor-device mounted board of the first embodiment, the recess 14X in the wiring pattern 14, corresponding to the recess 41X in the insulating layer 41, is formed and the external connection terminal 17 is fixed only to the bottom of the recess 14X of the wiring pattern 14. The portion of the external connection terminal 17 which touches the solder resist layer 16 may be freely moved. Therefore, even when the semiconductor-device mounted board 20 is connected to the mounting board, such as a mother board, and the coefficients of thermal expansion of the two boards differ, the internal stresses or residual stresses which may arise due to the difference in the coefficient of thermal expansion may be reduced. In addition, the recess 14X in the wiring pattern 14 is formed, and the volume of the material which constitutes the external connection terminal 17 is increased. Hence, the ability to reduce the internal stresses or residual stresses may be improved.

In a case in which the portion of each external connection terminal 17 projecting from the surface of the solder resist layer 16 is increased in size, the volume of the material which constitutes the external connection terminal 17 may also be increased and the ability to reduce the internal stresses or residual stresses may also be improved. However, in such a case, it is difficult to reduce the pitch of the external connection terminals 17. In the present embodiment, the recess 14X in the wiring pattern 14 is formed and the volume of the material which constitutes the external connection terminal 17 is increased without increasing the size of the portion of each external connection terminal 17 projecting from the surface of the solder resist layer 16. Hence, the difficulty in reducing the pitch of the external connection terminals 17 does not arise.

Next, the structure of a semiconductor-device mounted board of a second embodiment of the present disclosure will be described.

Figure 20:
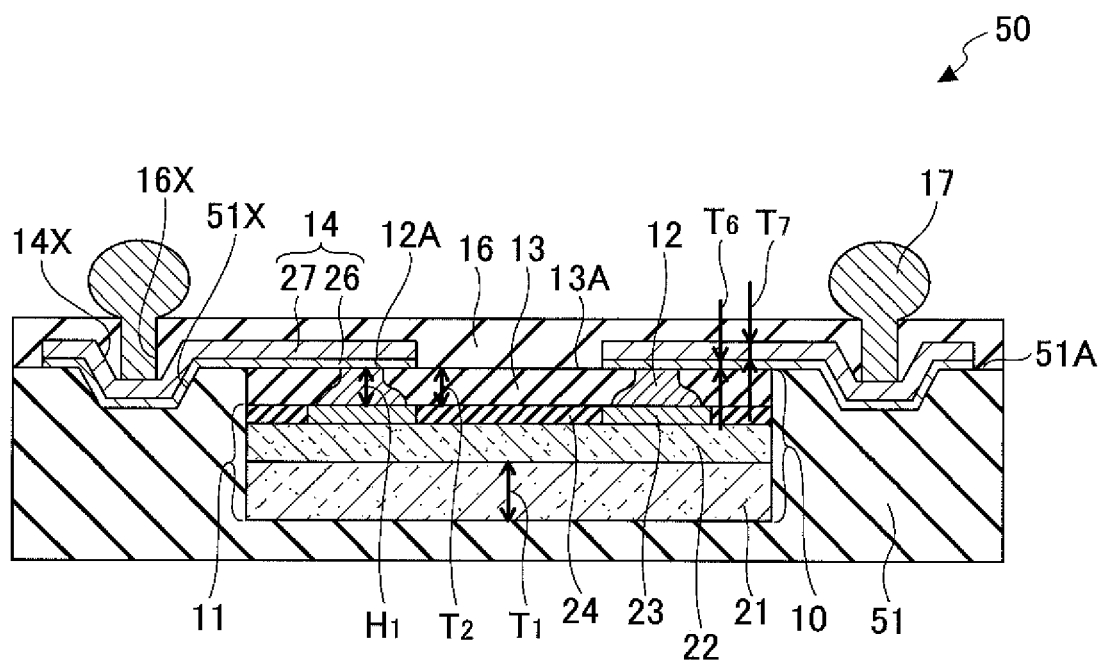
FIG. 20 is a cross-sectional view of a semiconductor-device mounted board of a second embodiment of the present disclosure.

FIG. 20 is a cross-sectional view of the semiconductor-device mounted board 50 of the second embodiment. In the semiconductor-device mounted board 50 shown in FIG. 20, the elements which are the same as corresponding elements in the semiconductor-device mounted board 20 shown in FIG. 1 are designated by the same reference numerals, and a description thereof will be omitted.

As shown in FIG. 20, the semiconductor-device mounted board 50 of the second embodiment is essentially the same as the semiconductor-device mounted board 20 of the first embodiment, except that the insulating layer 41 in the semiconductor-device mounted board 20 of the first embodiment is replaced by an insulating layer 51 in the second embodiment. In the following, description will be given of the structure of the semiconductor-device mounted board 50 of the second embodiment different from that of the semiconductor-device mounted board 20.

In the semiconductor-device mounted board 20 of the first embodiment, the insulating layer 41 is formed to cover the side surfaces of the semiconductor device 10. However, in the semiconductor-device mounted board 50 of this embodiment, the insulating layer 51 is formed to cover the side surfaces and the bottom surface of the semiconductor device 10. As the material of the insulating layer 51, a resin material, such as an epoxy resin and a polyimide resin, may be used. With this structure, the bottom surface of the semiconductor device 10 may also be protected by the insulating layer 51.

Next, a manufacturing method of the semiconductor-device mounted board of the second embodiment will be described.

Figure 21:
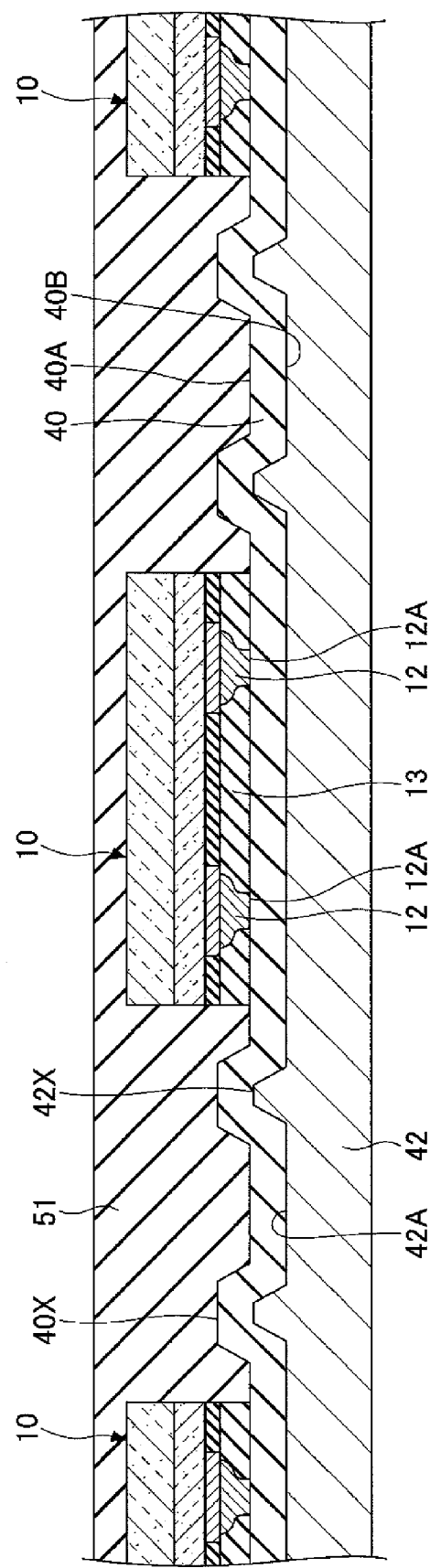
FIG. 21 is a diagram for explaining a manufacturing method of the semiconductor-device mounted board of the second embodiment.
Figure 22:
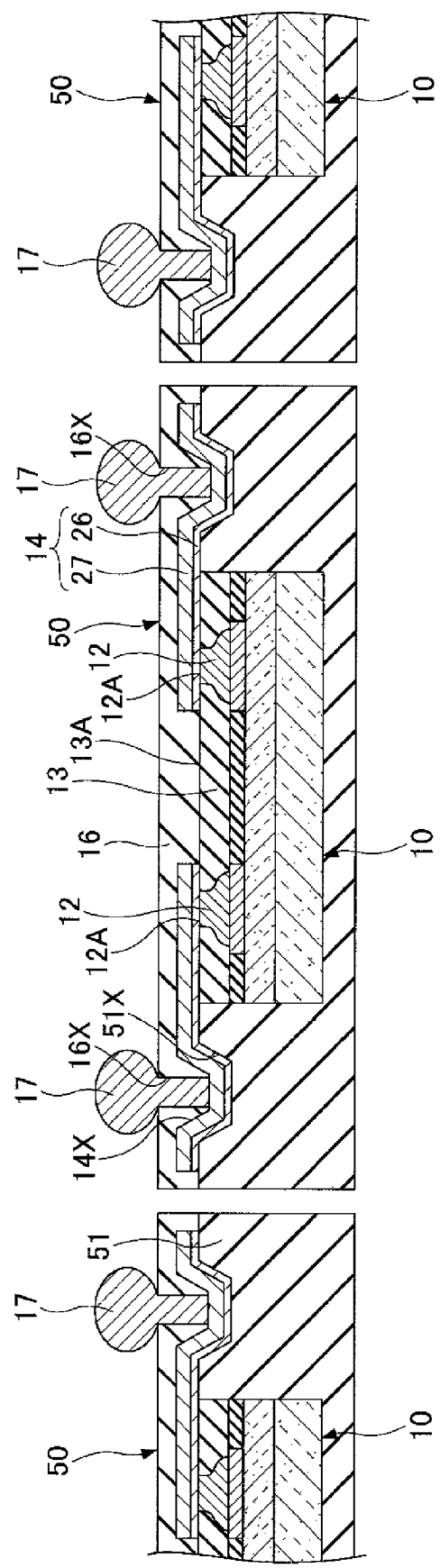
FIG. 22 is a diagram for explaining the manufacturing method of the semiconductor-device mounted board of the second embodiment.

FIG. 21 and FIG. 22 are diagrams for explaining the manufacturing method of the semiconductor-device mounted board of the second embodiment. In FIGS. 21 and 22, the elements which are the same as corresponding elements of the semiconductor-device mounted board 50 shown in FIG. 20 are designated by the same reference numerals, and a description thereof will be omitted.

First, in the manufacturing method of the second embodiment, the steps which are the same as the corresponding steps of the manufacturing method of the first embodiment as shown in FIGS. 2 to 13 are performed.

Subsequently, at the step shown in FIG. 21, the insulating layer 51 is formed on the surface 40A of the first support medium 40 to cover the side surfaces and the bottom surface of each semiconductor device 10. As the material of the insulating layer 51, a resin material, such as an epoxy resin and a polyimide resin, may be used. A typical method of forming the insulating layer 51 is as follows. A resin film, such as an epoxy resin or a polyimide resin, is deposited on the surface 40A of the first support medium 40 and on the bottom surface of each semiconductor device 10, and the resin film is pressed down and then heat-treated at a temperature of about 190 degrees C., for example, so that the resin film is cured and the insulating layer 51 may be produced.

An alternative method of forming the insulating layer 51 is as follows. A liquefied resin material, such as an epoxy resin or a polyimide resin, is applied to the surface 40A of the first support medium 40 and the bottom surface of each semiconductor device 10. Thereafter, the resin material is heat-treated at a temperature of about 190 degrees C., for example, so that the resin material is cured and the insulating layer 51 may be produced.

Subsequently, the steps which are the same as the corresponding steps of the manufacturing method of the first embodiment as shown in FIGS. 15 to 18 are performed in the manufacturing method of the second embodiment.

Subsequently, at the step shown in FIG. 22, the structure of the second embodiment equivalent to the structure shown in FIG. 18 is cut in the center of the insulating layer 51 (which covers the side surfaces of each semiconductor device 10) into pieces, and the plurality of semiconductor-device mounted boards 50 are produced. For example, the cutting of the structure of the second embodiment equivalent to that shown in FIG. 18 may be performed by dicing.

According to the manufacturing method of the semiconductor-device mounted board of the second embodiment, the same effects as those of the first embodiment may be obtained. The semiconductor-device mounted board 50 of the second embodiment might be inferior to the semiconductor-device mounted board 20 of the first embodiment with respect to the heat dissipation properties of the heat generated by the semiconductor device 10. However, the semiconductor-device mounted board 50 of the second embodiment would be useful for a case in which it is desired to protect the bottom surface of the semiconductor device 10.

Next, a manufacturing method of the semiconductor-device mounted board of a third embodiment of the present disclosure will be described. In the manufacturing method of the third embodiment, the steps (refer to FIGS. 23 and 24) which are different from the steps of the manufacturing method of the first embodiment as shown in FIGS. 12 to 14 are performed. A description will be given of the different steps in the manufacturing method of the third embodiment.

Figure 23:
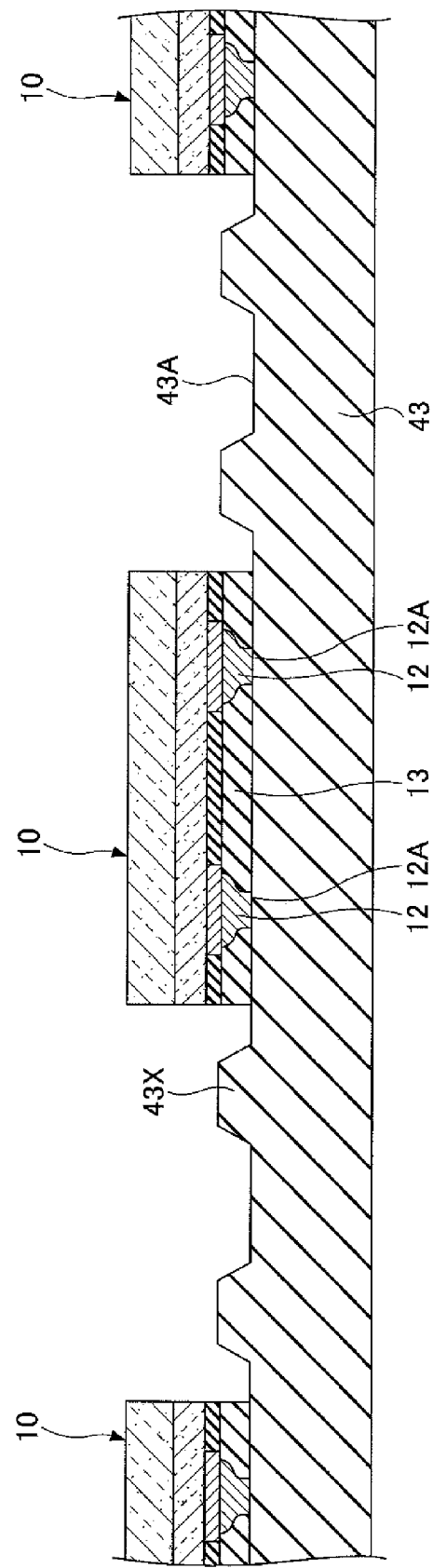
FIG. 23 is a diagram for explaining a manufacturing method of a semiconductor-device mounted board of a third embodiment of the present disclosure.
Figure 24:
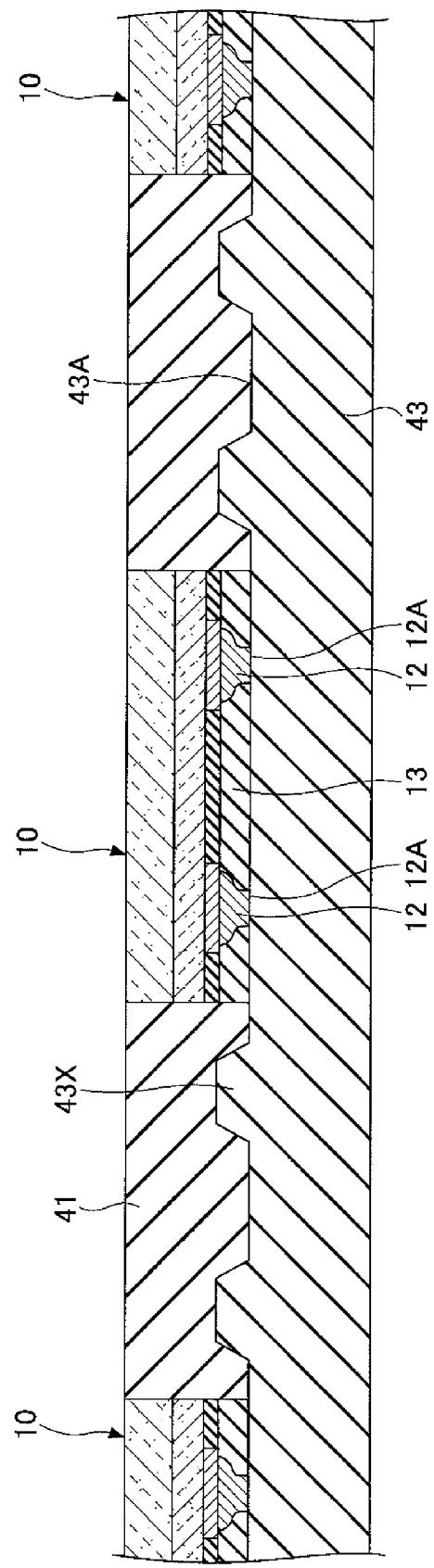
FIG. 24 is a diagram for explaining the manufacturing method of the semiconductor-device mounted board of the third embodiment.

FIG. 23 and FIG. 24 are diagrams for explaining the manufacturing method of the semiconductor-device mounted board of the third embodiment. In FIGS. 23 and 24, the elements which are the same as corresponding elements as shown in FIGS. 12 to 14 are designated by the same reference numerals, and a description thereof will be omitted.

First, in the manufacturing method of the third embodiment, the steps which are the same as the corresponding steps of the manufacturing method of the first embodiment as shown in FIGS. 2 to 11 are performed.

Subsequently, at the step shown in FIG. 23, a third support medium 43 in which a plurality of convex parts 43X are formed on the surface 43A is prepared. The plurality of semiconductor devices 10 are disposed on the surface 43A of the third support medium 43 so that the surface 12A of each connection terminal 12 is in contact with the surface 43A of the third support medium 43. For example, the surface 43A of the third support medium 43 has adhesion properties, and the disposed semiconductor devices 10 are temporarily fixed. If the surface 43A of the third support medium 43 has no adhesion properties, the semiconductor devices 10 may be temporarily fixed by using, for example, an adhesive tape.

A metal plate, a glass plate, etc. may be used as the material of the third support medium 43. Because the third support medium 43 differs from a metallic mold etc., an inexpensive material may be used as the material of the third support medium 43 such that the third support medium 43 once it is used may be discarded.

For example, the shape of each convex part 43X may be a truncated cone shape. However, the shape of each convex part 43X is not limited to the truncated cone shape. Alternatively, the shape of each convex part 43X may be a hemispherical shape or a cylindrical shape.

When each convex part 43X is in the shape of truncated cone, both a diameter of the top surface of the truncated cone of the convex part 43X and a diameter of the bottom surface thereof may be on the order of 100 to 500 micrometers. The convex part 43X may have a height on the order of 50 to 250 micrometers. In the following, an example in which each convex part 43X is formed in a truncated cone shape will be described.

Subsequently, at the step shown in FIG. 24, the insulating layer 41 is formed on the surface 43A of the third support medium 43 to cover the side surfaces of each semiconductor device 10. As the material of the insulating layer 41, a resin material, such as an epoxy resin or a polyimide resin, may be used. A typical method of forming the insulating layer 41 is as follows. A resin film, such as an epoxy resin or a polyimide resin, is deposited on the surface 43A of the third support medium 43, and the resin film is pressed down and then heat-treated at a temperature of about 190 degrees C., for example, so that the resin film is cured and the insulating layer 41 may be formed.

An alternative method of forming the insulating layer 41 is as follows. A liquefied resin material, such as an epoxy resin or a polyimide resin, is applied to the surface 43A of the third support medium 43. Thereafter, the resin material is heat-treated at a temperature of about 190 degrees C., for example, so that the resin material is cured and the insulating layer 41 may be produced.

Figure 15:
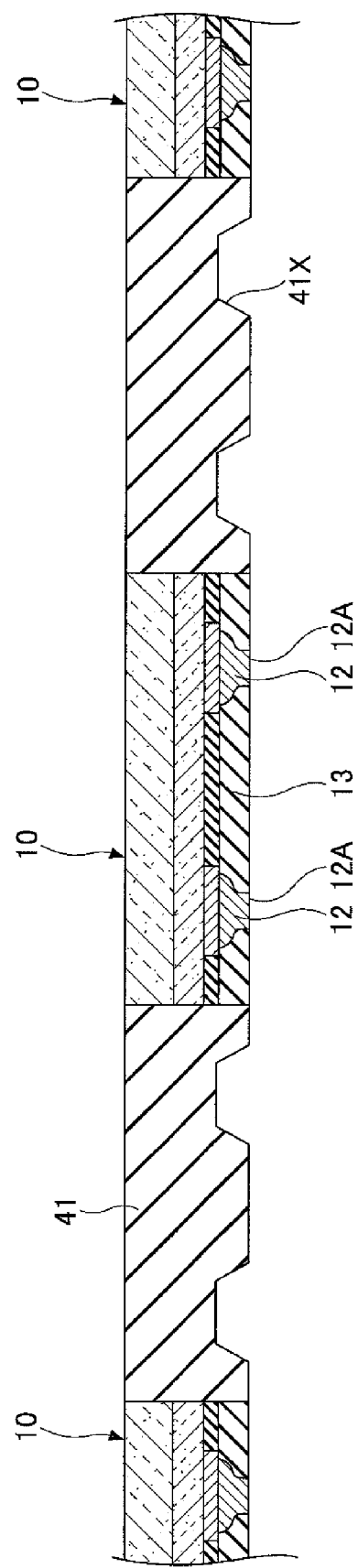
FIG. 15 is a diagram for explaining the manufacturing method of the semiconductor-device mounted board of the first embodiment.
Figure 16:
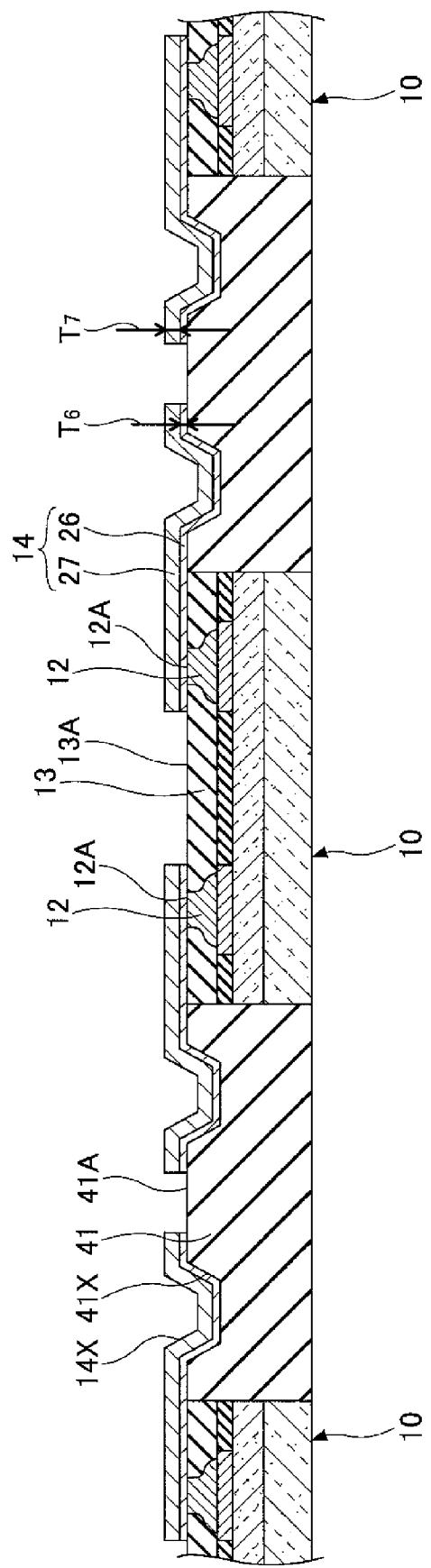
FIG. 16 is a diagram for explaining the manufacturing method of the semiconductor-device mounted board of the first embodiment.

Subsequently, the third support medium 43 is removed and the structure of the third embodiment equivalent to the structure of the first embodiment shown in FIG. 15 is produced. Namely, the shape of each convex part 43X of the third support medium 43 is transferred to the insulating layer 41 and the recess 41X in the insulating layer 41 is formed. Each recess 41X is formed in a truncated cone shape corresponding to the shape of each convex part 43X. The third support medium 43 can easily be removed.

According to the manufacturing method of the semiconductor-device mounted board of the third embodiment, the same effects as those of the first and second embodiments may be obtained. In addition, the manufacturing method of the third embodiment provides the following effects. Namely, using an adhesive tape, the semiconductor device is temporarily fixed to the third support medium having the convex parts, and it is no longer necessary to apply vacuum pressure using the second support medium as a mold. The first and second support media of the first and second embodiments may be replaced by the third support medium only and it is possible to reduce the manufacturing cost.

Next, the structure of a semiconductor-device mounted board of a fourth embodiment of the present disclosure will be described.

The structure of the semiconductor-device mounted board of the fourth embodiment differs from that of the semiconductor-device mounted board of the first embodiment.

Figure 25:
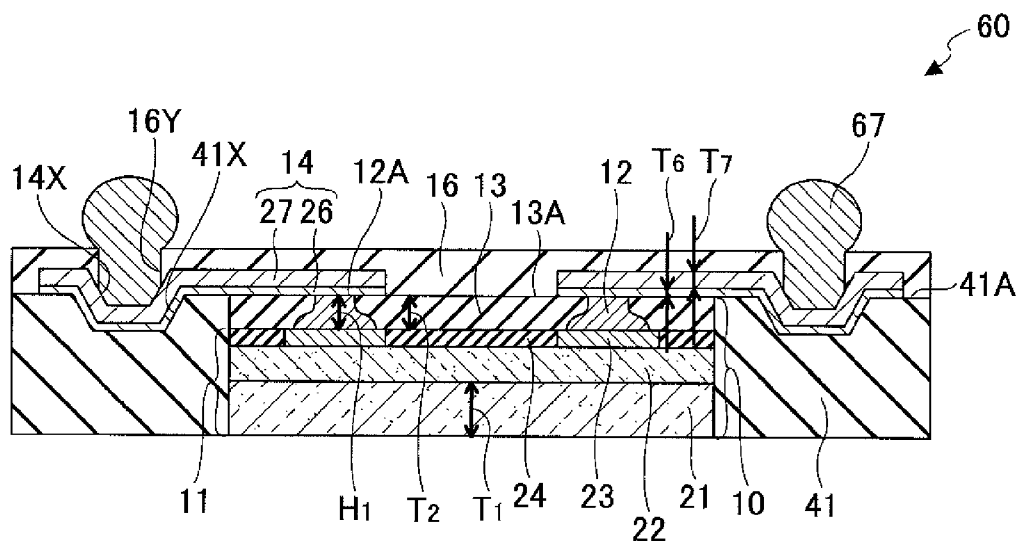
FIG. 25 is a cross-sectional view of a semiconductor-device mounted board of a fourth embodiment of the present disclosure.

FIG. 25 is a cross-sectional view of the semiconductor-device mounted board 60 of the fourth embodiment. In FIG. 25, the elements which are the same as corresponding elements in FIG. 1 are designated by the same reference numerals, and a description thereof will be omitted.

As shown in FIG. 25, the semiconductor-device mounted board 60 is essentially the same as the semiconductor-device mounted board 20 of the first embodiment. However, the semiconductor-device mounted board 60 is arranged so that the opening 16X of the solder resist layer 16 of the semiconductor-device mounted board 20 of the first embodiment is replaced by an opening 16Y of the fourth embodiment, and the external connection terminal 17 of the first embodiment is replaced by an external connection terminal 67 of the fourth embodiment. In the following, a description will be given of the difference in structure between the semiconductor-device mounted board 60 of the fourth embodiment and the semiconductor-device mounted board 20 of the first embodiment.

The manufacturing method of the semiconductor-device mounted board 60 is the same as the manufacturing method of the semiconductor-device mounted board 20, and a description thereof will be omitted.

In the fourth embodiment, the solder resist layer 16 is formed to cover the wiring pattern 14, the surface 13A of the insulating layer 13, and the surface 41A of the insulating layer 41. The solder resist layer 16 includes an opening 16Y in which the bottom and the inside surface (an inclined surface) of the recess 14X of the wiring pattern 14 are partially exposed. For example, the material of the solder resist layer 16 may be a photo-imageable resin material.

In the fourth embodiment, each external connection terminal 67 is fixed to the bottom and the inside surface (an inclined surface) of the recess 14X of the wiring pattern 14 which are partially exposed in the opening 16Y of the solder resist layer 16. A portion of the external connection terminal 67 is in contact with the surface of the solder resist layer 16 (including the inside surface of the opening 16Y) but the external connection terminal 67 is not fixed to the solder resist layer 16. The external connection terminal 67 is electrically connected to the wiring pattern 14.

For example, the external connection terminal 67 is an electrode terminal which is electrically connected to a pad provided on a mounting board (not shown), such as a mother board. For example, a solder bump or the like may be used as the external connection terminal 67. For example, the material of each external connection terminal 67 may be one of an alloy containing Pb, an alloy of Sn and Cu, an alloy of Sn and Ag, an alloy of Sn, Ag and Cu, etc. Alternatively, a solder ball (Sn-3.5Ag) using a resin material (for example, divinylbenzene) as a core thereof may be used as the external connection terminal 67. The external connection terminal 67 is of the fan-out type. The external connection terminal 67 is disposed in a region of the semiconductor-device mounted board 60 which is located outside the region where the semiconductor device 10 is mounted.

Accordingly, the external connection terminal 67 is fixed only to the bottom and the inside surface (an inclined surface) of the recess 14X of the wiring pattern 14 and the portion of the external connection terminal 67 which touches the solder resist layer 16 is freely movable. Hence, when the semiconductor-device mounted board 60 is implemented in and connected to the mounting board, such as a mother board, and the respective coefficients of thermal expansion of the semiconductor-device mounted board 60 and the mother board differ from each other, the internal stresses or residual stresses which may arise due to the difference in the coefficient of thermal expansion can be reduced. In addition, the recess 14X is formed in the wiring pattern 14 and the volume of the material which constitutes the external connection terminal 67 is increased, so that the ability to reduce the internal stresses or residual stresses can be improved.

However, when compared with the external connection terminals of the first to third embodiments, the portion of the external connection terminal 67 of the fourth embodiment that is freely movable is decreased, and the ability to reduce the internal stresses or residual stresses may be lower than that in the first to third embodiments.

If the size of the portion of the external connection terminal 67 projecting from the surface of the solder resist layer 16 is increased in order to increase the volume of the material which constitutes the external connection terminal 67, then the ability to reduce the internal stresses or residual stresses would be improved. However, there is a problem in that it is difficult to reduce the pitch of the external connection terminals 67 because of the increased size of each external connection terminal 67 in such a case. In this embodiment, the recess 14X is formed in the wiring pattern 14 and the volume of the material which constitutes the external connection terminal 67 is increased without increasing the size of the portion of the external connection terminal 67 projecting from the surface of the solder resist layer 16. Hence, in this embodiment, the problem that it is difficult to reduce the pitch of the external connection terminals 67 does not arise.

Next, the structure of a semiconductor-device mounted board of a fifth embodiment of the present disclosure will be described.

The structure of the semiconductor-device mounted board of the fifth embodiment differs from that of the semiconductor-device mounted board of the first embodiment.

Figure 26:
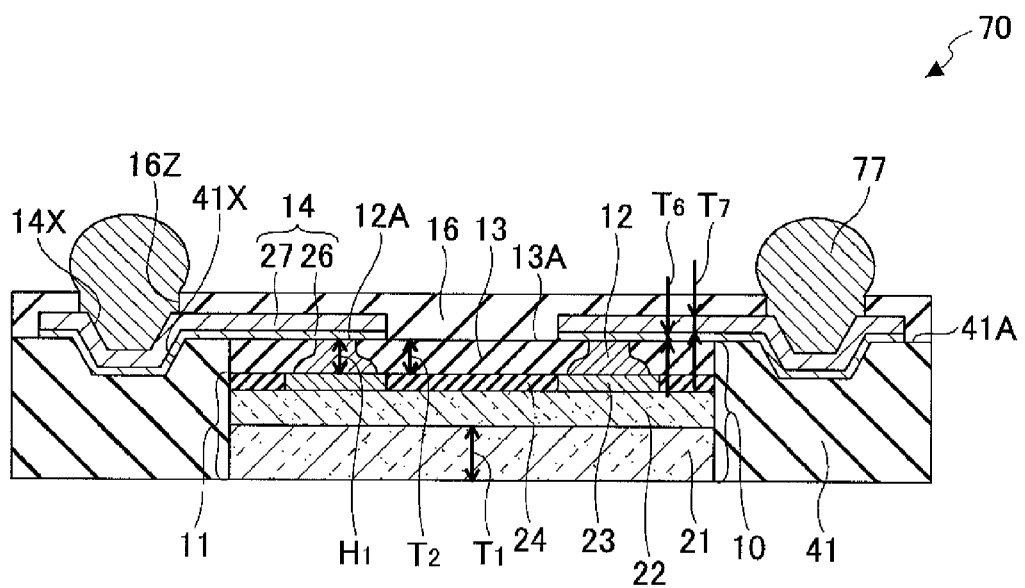
FIG. 26 is a cross-sectional view of a semiconductor-device mounted board of a fifth embodiment of the present disclosure.

FIG. 26 is a cross-sectional view of the semiconductor-device mounted board 70 of the fifth embodiment. In FIG. 26, the elements which are the same as corresponding elements in FIG. 1 are designated by the same reference numerals, and a description thereof will be omitted.

As shown in FIG. 26, the semiconductor-device mounted board 70 is essentially the same as the semiconductor-device mounted board 20 of the first embodiment. However, the semiconductor-device mounted board 70 is arranged so that the opening 16X of the solder resist layer 16 of the semiconductor-device mounted board 20 of the first embodiment is replaced by an opening 16Z of the fifth embodiment, and the external connection terminal 17 of the first embodiment is replaced by an external connection terminal 77 of the fifth embodiment. In the following, a description will be given of the difference in structure between the semiconductor-device mounted board 70 of the fifth embodiment and the semiconductor-device mounted board 20 of the first embodiment.

The manufacturing method of the semiconductor-device mounted board 70 is the same as the manufacturing method of the semiconductor-device mounted board 20, and a description thereof will be omitted.

In the fifth embodiment, the solder resist layer 16 is formed to cover the wiring pattern 14, the surface 13A of the insulating layer 13, and the surface 41A of the insulating layer 41. The solder resist layer 16 includes an opening 16Z in which the whole surface of the recess 14X of the wiring pattern 14 is exposed. For example, the material of the solder resist layer 16 may be a photo-imageable resin material.

In the fifth embodiment, each external connection terminal 77 is fixed to the region containing the recess 14X of the wiring pattern 14 which is exposed in the opening 16Z of the solder resist layer 16. A portion of the external connection terminals 77 is in contact with the inside surface of the opening 16Z of the solder resist layer 16, but the external connection terminal 77 is not fixed to the solder resist layer 16. The external connection terminal 77 is electrically connected to the wiring pattern 14.

For example, the external connection terminal 77 is an electrode terminal which is electrically connected to a pad provided on a mounting board (not shown), such as a mother board. For example, a solder bump or the like may be used as the external connection terminal 77. For example, the material of each external connection terminal 77 may be one of an alloy containing Pb, an alloy of Sn and Cu, an alloy of Sn and Ag, an alloy of Sn, Ag and Cu, etc. Alternatively, a solder ball (Sn-3.5Ag) using a resin material (for example, divinylbenzene) as a core thereof may be used as the external connection terminal 77. The external connection terminal 77 is of the fan-out type. The external connection terminal 77 is disposed in a region of the semiconductor-device mounted board 70 which is located outside the region where the semiconductor device 10 is mounted.

Accordingly, the recess 14X is formed in the wiring pattern 14, the external connection terminal 77 is fixed to the region containing the recess 14X of the wiring pattern 14, and the volume of the material which constitutes the external connection terminal 77 is increased, so that the ability to reduce the internal stresses or residual stresses may be improved.

However, when compared with the external connection terminals of the first to fourth embodiments, the portion of the external connection terminal 77 that is freely movable is decreased, and the ability to reduce the internal stresses or residual stresses may be lower than that in the first to fourth embodiments.

If the size of the portion of the external connection terminal 77 projecting from the surface of the solder resist layer 16 is increased in order to increase the volume of the material which constitutes the external connection terminal 77, then the ability to reduce the internal stresses or residual stresses would be increased. However, there is a problem in that it is difficult to reduce the pitch of the external connection terminals 77 because of the increased size of each external connection terminal 77 in such a case. In this embodiment, the recess 14X is formed in the wiring pattern 14 and the volume of the material which constitutes the external connection terminal 77 is increased without increasing the size of the portion of the external connection terminal 77 projecting from the surface of the solder resist layer 16. Hence, in this embodiment, the problem that it is difficult to reduce the pitch of the external connection terminals 77 does not arise.

According to the present disclosure, it is possible to provide a semiconductor-device mounted board and a method of manufacturing a semiconductor-device mounted board which allow high-density formation of connection terminals on a semiconductor device to electrically connect a wiring pattern (re-wiring) and a semiconductor integrated circuit of the semiconductor device and prevent increasing of the manufacturing cost.

The present disclosure is not limited to the above-described embodiments, and variations and modifications may be made without departing from the scope of the invention. For example, modifications may be made by combining the second embodiment with the fourth embodiment or the fifth embodiment.

What is claimed is:

1. A method of manufacturing a semiconductor-device mounted board, comprising:
   forming connection terminals on electrode pads of a semiconductor integrated circuit respectively;
   forming a first insulating layer on the semiconductor integrated circuit to cover the connection terminals formed on the electrode pads;
   disposing a plate-like medium on the first insulating layer, the plate-like medium having a rough surface on a side of the plate-like medium facing the first insulating layer;
   pressing the rough surface of the plate-like medium on the first insulating layer so that the first insulating layer is compressed and a part of each of the connection terminals is exposed from the first insulating layer;
   removing the plate-like medium from the first insulating layer to produce a semiconductor device containing the semiconductor integrated circuit;
   forming a second insulating layer which covers at least side surfaces of the semiconductor device, the second insulating layer including recesses on a surface of the second insulating layer on the same side as the exposed parts of the connection terminals; and forming a wiring pattern which covers a surface of the first insulating layer including the exposed parts of the connection terminals and a surface of the second insulating layer including the recesses, the wiring pattern being electrically connected to the exposed parts of the connection terminals and including recesses each having a shape in conformity with a shape of one of the recesses of the second insulating layer.

2. The method according to claim 1, wherein the forming of the second insulating layer comprises:

preparing a first support medium;

disposing the semiconductor device on a first surface of the first support medium so that the exposed parts of the connection terminals are in contact with the first surface of the first support medium;

preparing a second support medium in which convex parts are formed on a first surface of the second support medium; and disposing the semiconductor device with the first support medium on the first surface of the second support medium so that a second surface of the first support medium is in contact with the first surface of the second support medium and the semiconductor device is disposed in a region where the convex parts of the second support medium are not formed.

3. The method according to claim 2, wherein the forming of the second insulating layer further comprises:

pneumatically attracting the first support medium to the first surface of the second support medium by pressure so that convex parts corresponding to the convex parts of the second support medium are formed in the first support medium;

forming the second insulating layer on the first surface of the first support medium in a region where the convex parts of the first support medium are formed, such that the second insulating layer is formed to cover at least the side surfaces of the semiconductor device disposed on the first surface of the first support medium; and removing the first support medium and the second support medium.

4. The method according to claim 1, further comprising forming a protective layer which covers the wiring pattern, the surface of the first insulating layer, and the surface of the second insulating layer, the protective layer including openings in which the wiring pattern included in the recesses of the second insulating layer is exposed.

5. The method according to claim 4, further comprising forming external connection terminals on the protective layer, the external connection terminals being electrically connected to the wiring pattern exposed in the openings of the protective layer.

6. The method according to claim 4, wherein the forming of the protective layer is arranged so that only a part of the wiring pattern included in the recesses of the second insulating layer is exposed in the openings of the protective layer.

7. The method according to claim 6, wherein only a part of the wiring pattern on a bottom of the recesses of the second insulating layer is exposed in the openings of the protective layer.

8. The method according to claim 1, wherein the forming of the second insulating layer is arranged so that the second insulating layer is formed to cover the side surfaces of the semiconductor device and a bottom surface of the semiconductor device.

9. A semiconductor-device mounted board, comprising:

a semiconductor device in which connection terminals are formed on electrode pads of a semiconductor integrated circuit and a first insulating layer is formed over the semiconductor integrated circuit so that parts of the connection terminals are exposed from the first insulating layer;

a second insulating layer formed to cover at least side surfaces of the semiconductor device and include recesses on a surface of the second insulating layer on the same side as the exposed parts of the connection terminals;

a wiring pattern formed to cover a surface of the first insulating layer including the exposed parts of the connection terminals and a surface of the second insulating layer including the recesses, the wiring pattern being electrically connected to the exposed parts of the connection terminals and including recesses each having a shape in conformity with a shape of one of the recesses of the second insulating layer; and a protective layer formed to cover the wiring pattern, the surface of the first insulating layer, and the surface of the second insulating layer, the protective layer including openings in which the wiring pattern included in the recesses of the second insulating layer is partially exposed.

\* \* \* \* \*